(12) United States Patent
Maharrey et al.

(10) Patent No.: US 10,181,851 B2
(45) Date of Patent: Jan. 15, 2019

(54) DUAL INTERLOCKED LOGIC CIRCUITS

(71) Applicant: VANDERBILT UNIVERSITY, Nashville, TN (US)

(72) Inventors: Jeffrey Maharrey, Nashville, TN (US); Jeff Kauppila, Brentwood, TN (US); Dennis Ball, Henderson, TN (US); W. Timothy Holman, Nashville, TN (US); Lloyd W. Massengill, Brentwood, TN (US)

(73) Assignee: Vanderbilt University, Nashville, TN (US)

( * ) Notice: Subject to any disclaimer, the term of this patent is extended or adjusted under 35 U.S.C. 154(b) by 0 days.

(21) Appl. No.: 15/926,620

(22) Filed: Mar. 20, 2018

(65) Prior Publication Data

US 2018/0367143 A1   Dec. 20, 2018

Related U.S. Application Data

(60) Provisional application No. 62/473,826, filed on Mar. 20, 2017.

(51) Int. Cl.
*H03K 19/003*   (2006.01)
(52) U.S. Cl.
CPC .............................. *H03K 19/00338* (2013.01)
(58) Field of Classification Search
CPC ............. H03K 19/003; H03K 19/0033; H03K 19/00338; H03K 19/0175;
(Continued)

(56) References Cited

U.S. PATENT DOCUMENTS 7,023,235 B2 *   4/2006   Hoff ..................... G11C 11/4125
                                                                      326/10
7,515,452 B1 *   4/2009   de Jong .................... G11C 8/04
                                                                      365/156
(Continued)

OTHER PUBLICATIONS

Daniel R. Blum et al., "Schemes for Eliminating Transient-Width Clock Overhead From SET-Tolerant Memory-Based Systems," IEEE Transactions on Nuclear Science, vol. 53, No. 3, Jun. 2006, pp. 1564-1573.

(Continued)

*Primary Examiner* — Jason Crawford
(74) *Attorney, Agent, or Firm* — Nixon Peabody LLP; Eduardo J. Quinones

(57) ABSTRACT

An electronic device with one or more gates that each include first circuit blocks configured for implementing a first N-type logic function and second circuit blocks configured for implementing a second N-type logic function that is a complement of the first N-type logic function. In the electronic device, a number of the of first circuit blocks and a number of the second circuit blocks are the same. Further, the first circuit blocks and the second circuit blocks each have a block feedback node, a block output node, and one or more block input logic nodes. Also, the block feedback node for each one of the first circuit blocks is singly coupled to the block output node of one of the second circuit blocks and the block output node of the one of the first circuit blocks is singly coupled to the block feedback node of another of the second circuit blocks.

8 Claims, 27 Drawing Sheets

(58) Field of Classification Search
CPC ....... H03K 19/017509; H03K 19/0185; H03K 19/018507; H03K 19/018514; H03K 19/018521; H03K 19/018528
See application file for complete search history.

(56) References Cited

U.S. PATENT DOCUMENTS

| | | | | |
|---|---|---|---|---|
| 7,719,304 | B1* | 5/2010 | Clark | H03K 3/0372 326/14 |
| 8,081,010 | B1* | 12/2011 | Whitaker | H03K 19/0075 326/11 |
| 8,873,278 | B1* | 10/2014 | Xu | H03K 19/0033 365/154 |
| 2010/0264953 | A1* | 10/2010 | Lilja | G06F 17/5068 326/12 |
| 2013/0162293 | A1* | 6/2013 | Lilja | H03K 19/215 326/54 |
| 2014/0157223 | A1* | 6/2014 | Lilja | G06F 17/5068 716/138 |
| 2018/0130518 | A1* | 5/2018 | Ko | G11C 11/412 |

OTHER PUBLICATIONS

Praveen Palakurthi, et al., "Radiation Hardened Level Shifter for Sub to Superthreshold Voltage Translation," ECE Department, The University of Texas at El Paso, El Paso, Texas 79968, Email—emac@utep.edu; 2012, 3 pages.

Jeffrey S. Kauppila, "Geometry-Aware Single-Event Enabled Compact Models for Sub-50 nm Partially Depleted Silicon-on-Insulator Technologies," IEEE Transactions on Nuclear Sciene, vol. 62, No. 4, Aug. 2015, pp. 1589-1598.

* cited by examiner

FIG. 16 Aii

FIG. 16 Aiii

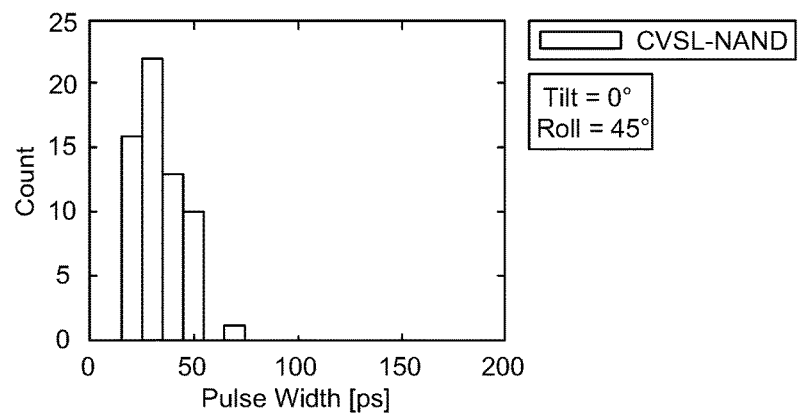
FIG. 16 Bi
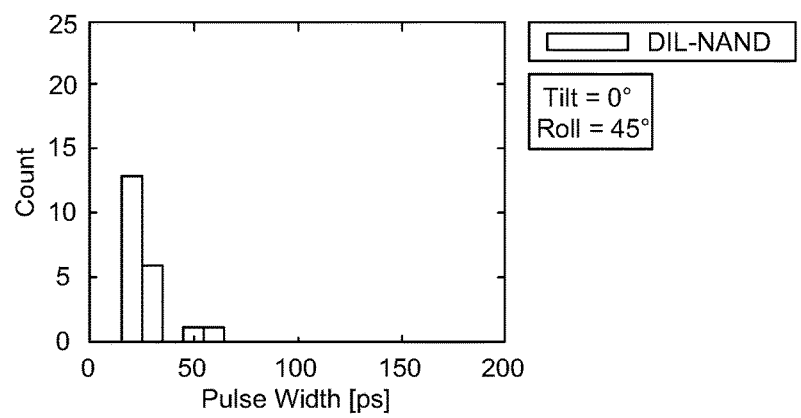
FIG. 16 Bii
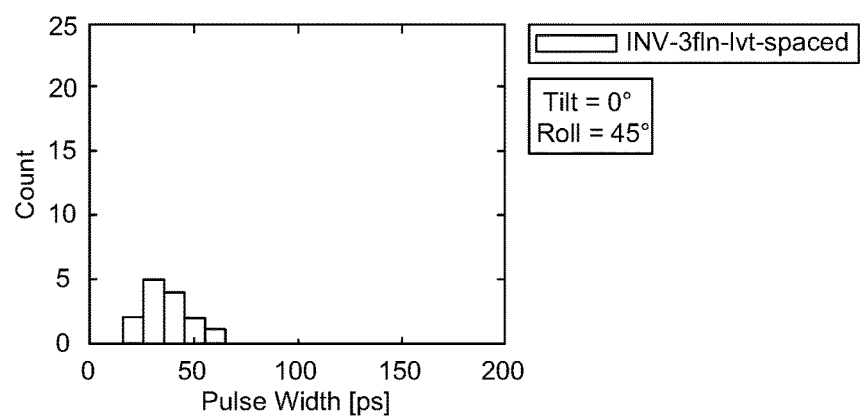
FIG. 16 Biii

FIG. 16 Cii 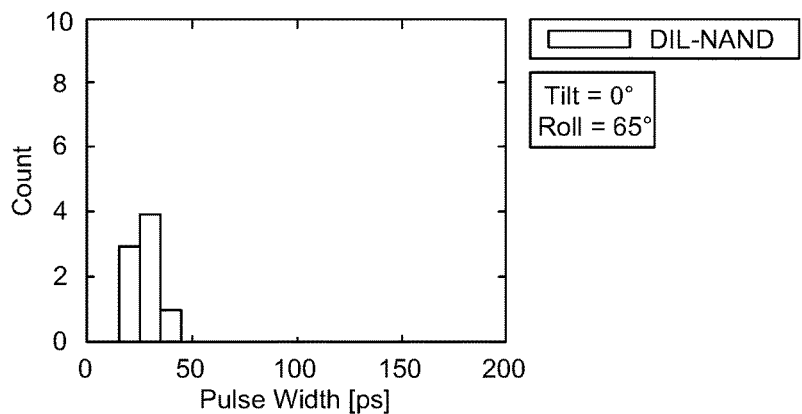
FIG. 16 Ciii 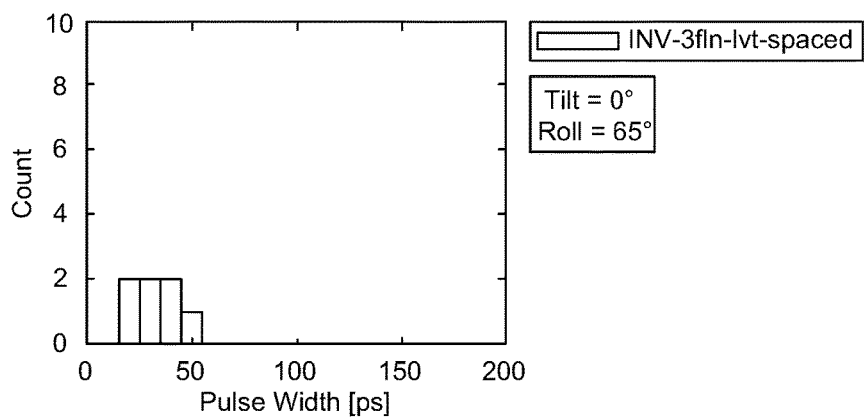

DUAL INTERLOCKED LOGIC CIRCUITS

CROSS-REFERENCE TO RELATED APPLICATIONS

This application claims priority to and the benefit of U.S. Provisional Patent Application No. 62/473,826, filed Mar. 20, 2017 and entitled "Dual Interlocked Logic," the contents of which are hereby incorporated by reference in their entirety as if fully set forth herein.

STATEMENT REGARDING FEDERALLY FUNDED RESEARCH

This invention was made with government support under Contract No. HDTRA1-13-C-0063 awarded by Defense Threat Reduction Agency. The government has certain rights in the invention.

FIELD OF THE INVENTION

The present invention relates to logic circuits, and more specifically to logic circuits resistant to electrical glitches.

BACKGROUND

A single event effect (SEE) is a short-term confined ionization effect in which a single particle interacts with the semiconductor material, causing the generation of excess free-carriers along the entirety of its path through the material. Single event effects may manifest themselves as single event upsets (SEU) or single event transients (SET). An SEU refers to the single-event induced corruption of a logic state in a storage element. An SET refers to a single-event induced, transient voltage signal at the node of a combinational logic element that competes with other legitimate data signals. An SET can lead to an SEU if the SET propagates to the input of a storage element and is latched. If an SEU is read by the system, the result is a soft error.

In digital integrated circuit design, sequential digital systems are typically structured such that data are clocked from the output of one storage element through combinational logic to the input of the next storage element. Single event transients generated in combinational logic are a major, often dominant, contributor to soft errors in integrated circuits. The radiation-hardened-by-design (RHBD) community has put forth much effort to address the problem of SETs, and numerous techniques have been developed to mitigate the effect of SETs. SET utilization techniques can generally be grouped into two categories: temporal mitigation and spatial mitigation. Temporal mitigation techniques involve a direct tradeoff between circuit speed and hardness since hardness is gained by inserting circuit delays proportional to the duration of the SET to be mitigated. Spatially redundant techniques circumvent the speed penalty of temporal techniques by triplicating the logic and using majority voting circuitry. However, spatially redundant techniques induce significant area and power penalties.

One method of dealing with SEUs in storage elements has been to use Dual Interlocked Storage CEll (DICE) latches. A conventional DICE latch schematic is shown in FIG. 1, where the feedback paths are interlocked to mitigate single-node upset susceptibility. The DICE latch immunity to single-node upsets is due to distributed logic storage across four separate circuit nodes and the restoring property of redundant, interlocked feedback loops. Although the DICE latch is robust to direct corruption by a single event, it is still vulnerable to SETs arriving at its data input terminal. For example, as noted by Blum and Delgado-Frias in "Schemes for Eliminating Transient-Width Clock Overhead From SET-Tolerant Memory-Based Systems," IEEE TRANSACTIONS ON NUCLEAR SCIENCE, VOL. 53, NO. 3, June 2006, DICE latches can only be used to provide hardened data transfer systems without combinational logic. In order to form a sequential digital system for purposes other than data transfer, combinational logic must be incorporated between the DICE latches, thus rendering the system vulnerable to SETs.

Hardened combinational logic is vital to designing a sequential system that is robust against single events. One way to demonstrate that combination logic is hardened against SETs is to show that an SET is not capable of propagating past subsequent combinational logic gates. For example, it has been demonstrated that traditional cascode voltage switched logic (CVSL) NAND gates do not propagate an SET that results in a 010 transition, however an SET resulting in a 101 transition is capable of propagating. The schematic of a generic CVSL gate, where the gate is comprised of a cross-coupled PMOS pair driven by complementary NMOS logic trees capable of implementing any boolean function, is shown in FIG. 2. The CVSL family is a differential logic family in that it requires both a true and complement input, and produces both a true and complement output. The cross-coupled PMOS pair in CVSL has the potential to be hardened via interlocked feedback. However, while CVSL gates have an increased tolerance to SETs compared to standard CMOS gate, they are still capable of propagating SETs in some cases. In particular, the generation and propagation of an SET in CVSL gates will be highly dependent on both the SET pulse width and the ratio of drive strengths between the PMOS half latch and the NMOS logic tree. Due to the dependence on SET pulse width and drive strength, the hardness of a CVSL gate is extremely dependent on transistor sizing, technology selection and environment setting. These dependencies require designers to fully characterize the radiation response of a technology in order to ensure hardness.

DETAILED DESCRIPTION

Figure 1:
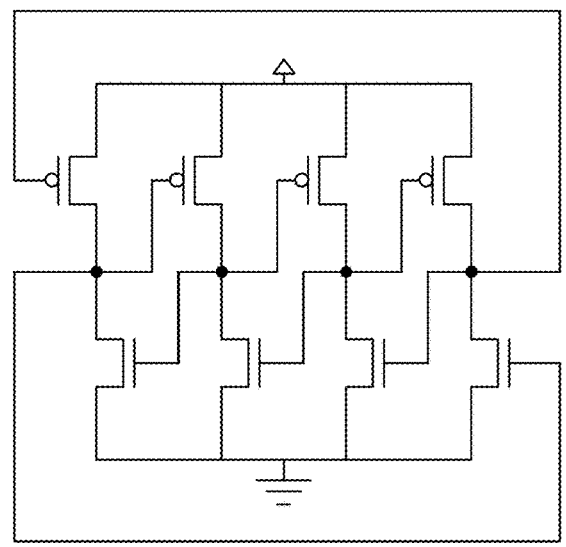
FIG. 1 is a schematic of a conventional DICE flip flop which is useful for describing the various embodiments.
Figure 2:
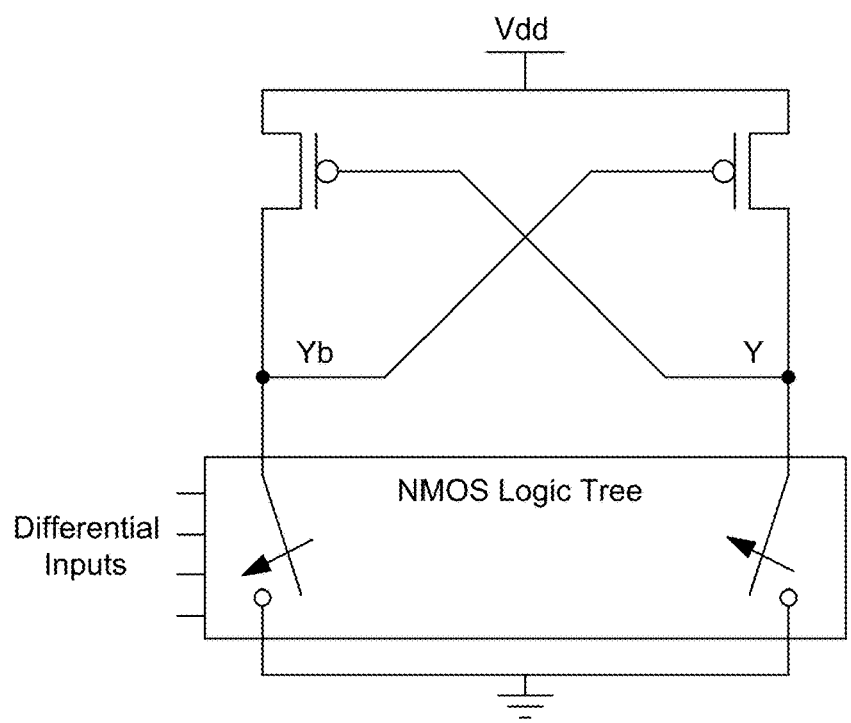
FIG. 2 is a schematic of a conventional CVSL gate which is useful for describing the various embodiments.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In view of the foregoing, the various embodiments are directed to a new hardening technique that leverages the concepts of the CVSL circuit family and a RHBD technique using interlocked feedback, similar to DICE. This new hardened logic topology, termed Dual Interlocked Logic (DIL), is an improvement over both static CMOS and traditional CVSL in that it prohibits the propagation of SETs of any polarity or duration. The new hardened logic topology can tolerate SETs of any pulse width and incurs no additional delay when compared to the traditional cascode voltage switch logic family.

Compared to previous logic hardening techniques, DIL has some clear advantages, as shown in Table I. Three dominant techniques for mitigation of SETs in combinational logic are (1) spatial Triple Modular Redundancy (TMR) or TMR spatial, (2) temporal TMR or TMR Temporal, and (3) Dual Modular Redundancy (DMR). DIL, as described herein, requires less circuit complexity than the other techniques, although it still requires duplicating the logic. In terms of speed penalties, DIL incurs no additional delay while the other techniques incur intentional delays associated with SET mitigation as well as additional delays associated with voting circuitry. One of the main advantages of DIL is that, similar to spatial TMR, it is inherently hardened against single node transients of any practical duration. It does not require any knowledge of the length of the SET being mitigated and can therefore be transitioned to different technology nodes without the knowledge of, or need for, experimental SET pulse width characterization required for temporal TMR or DMR. An additional attribute of DIL is the ability for it to be naturally integrated alongside a single differential DICE flip-flop to provide single-event robustness in both combinational logic and storage elements. This is possible due to DIL inherently producing two sets of differential outputs, and the DICE flip-flop accepting two sets of differential inputs.

TABLE I

Comparison of SET hardening techniques. Circuit complexity refers to the amount of circuitry required. Added delay is the speed penalty incurred by each technique. A technique is technology/environment dependent if knowledge of the SET pulse width or environment is required to assure hardness.

| Hardening Technique | Circuit Complexity* | Added Delay* | Technology/ Environment Dependent |
|---|---|---|---|
|  | 2X Logic | None | No |
| TMR Spatial | 3X Logic + 3X FF + 3X Voting | Voting delay | No |
| TMR Temporal | 3X FF + 2X Delay + 1X Voting | 2X Max SET | Yes |
| DMR | 2X Logic + 1X Voting | 1X Max SET | Yes |

*AS COMPARED TO CVSL

The DIL topology described herein consists of a gate defined by 2N PMOS devices, where N≥2, connected in an interlocked feedback fashion. The gate further includes redundant NMOS differential logic trees, represented by "n-logic" and "n-logic-bar," that drive the interlocked PMOS devices. As a result, the devices in the gate define circuit blocks that generate two sets of differential outputs (Y1, Y1-bar and Y2, Y2-bar), each of which are connected to the inputs of a subsequent block. In the various embodiments, when an SET occurs at one of the differential output nodes, at most one adjacent output node is perturbed.

Figure 3:
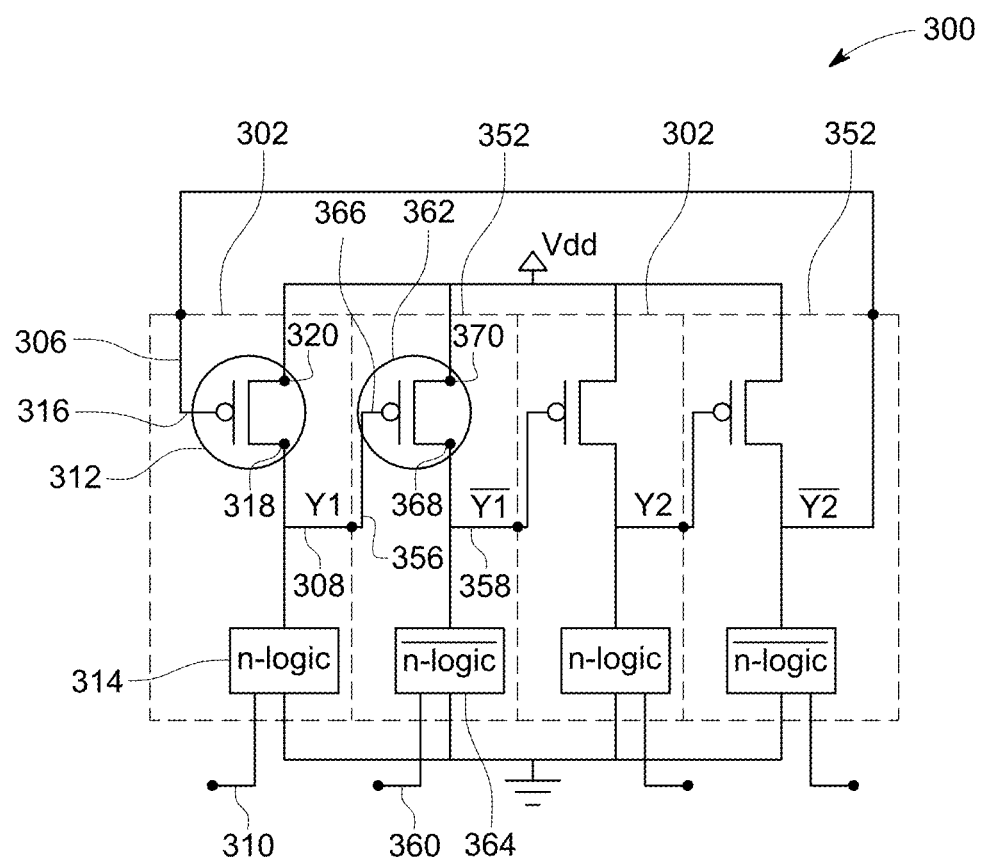
FIG. 3 is a schematic of a Dual Interlocked Logic (DIL) gate according to an embodiment of the invention.

A general schematic of a DIL gate topology according to the various embodiments is illustrated in FIG. 3. As shown in FIG. 3, the DIL gate topology includes first circuit blocks 302 and second circuit blocks 352. The first circuit blocks 302 are configured for implementing a first N-type logic function and the second circuit blocks 352 are configured for implementing a second N-type function that is a complement of the first N-type function.

Each of the first circuit blocks 302 is arranged to include at least a block feedback node 306, a block output node 308, and one or more block logic input nodes 310 (depending on the N-type logic function being implemented in blocks 302). In first circuit block 302, the first N-type logic function is implemented via a combination of a pull-up circuit 312 and an N-type logic circuit 314 that implements the first N-type logic using N-type devices.

In particular embodiments, as shown in FIG. 3, the pull-circuit 312 can be a P-type MOSFET. In such a configuration, the control node 316 (i.e., the gate node) of the P-type MOSFET can be coupled to the block feedback node 306. Current nodes 318 and 320 (i.e., source and drain nodes of the P-type MOSFET) can be coupled to a voltage supply node (e.g., VDD) and the block output node 308, respectively. As such, current node 318 operates as a pull-up node when the P-type MOSFET of pull-up circuit 312 is turned on.

The N-type logic circuit 314 can be, as discussed above, any arrangement of N-type devices for implementing a particular logic function. As discussed above, the N-type logic circuit 314 can have one or more logic circuit input nodes (not shown) that correspond to the block input logic nodes 310 and which are coupled thereto.

Each of the second circuit blocks 352 is arranged similar to each of the first circuit blocks 302. Each of the second circuit blocks 352 includes at least a block feedback node 356, a block output node 358, and one or more block logic input nodes 360 (depending on the N-type logic function being implemented in blocks 352). In second circuit block 352, the second N-type logic function (that is a complement of the first N-type logic) is implemented via a combination of a pull-up circuit 362 and an N-type logic circuit 364 that implements second N-type logic function using N-type devices.

In particular embodiments, as shown in FIG. 3, the pull-up circuit 362 can be a P-type MOSFET. In such a configuration, the control node 366 (i.e., the gate node) of the P-type MOSFET can be coupled to the block feedback node 356. Current nodes 368 and 370 (i.e., source and drain nodes of the P-type MOSFET) can be coupled to a voltage supply node (e.g., VDD) and the block output node 358, respectively. As such, current node 368 operates as a pull-up node when the P-type MOSFET of pull-up circuit 362 is turned on.

The N-type logic circuit 364 can be, as discussed above, any arrangement of N-type devices for implementing a particular logic function. As discussed above, the N-type logic circuit 364 can have one or more logic circuit input nodes (not shown) that correspond to the block input logic nodes 360 and which are coupled thereto.

Now turning to FIGS. 4A-4D, there is provided an example configuration for using the DIL topology. In particular, FIGS. 4A-4D show how a transient generated as the result of a single-event striking a single node is not capable of propagating past the subsequent gate.

Figure 4A:
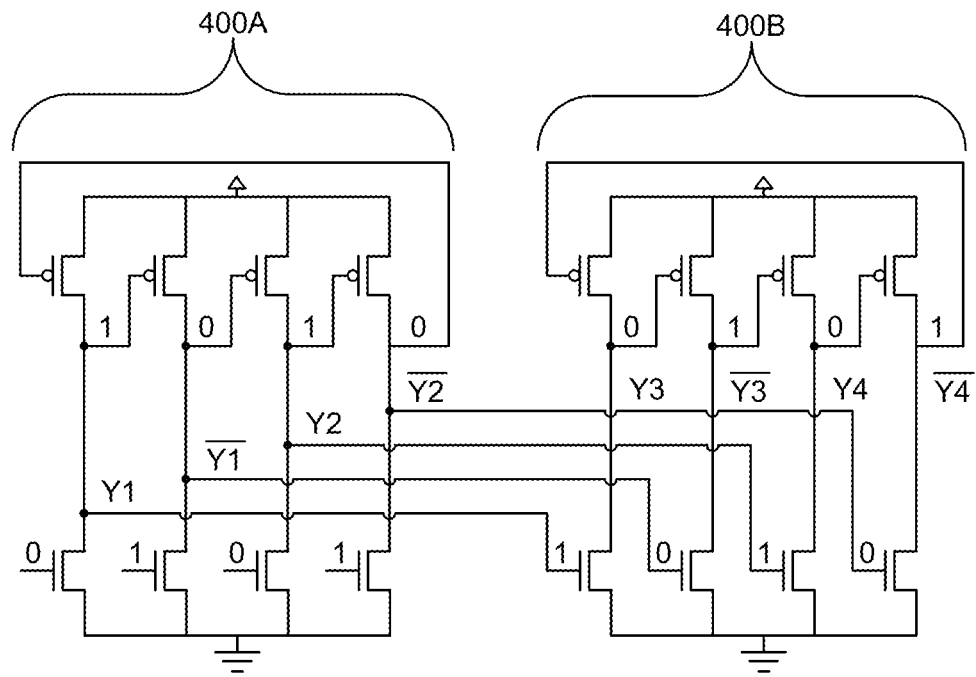
FIG. 4A shows two serially-connected DIL inverter gates according to an embodiment of the invention in their normal state.

FIG. 4A shows two serially-connected DIL inverter gates, 400A and 400B, according to an embodiment of the invention in their normal state. Each of the inverter gates 400A and 400B is arranged similar to the arrangement in FIG. 3. Further, as shown in FIG. 4A, each of the N-type logic circuits consists of a single N-type MOSFET with a gate providing the logic circuit input node coupled to the block input node and having its current nodes (i.e., source and drain node) coupled to the pull-up circuit and a reference node (i.e., ground node). In such a configuration, the N-type logic circuits provide an inverter logic function.

In normal operation, the logic inputs for the each of the N-type logic circuits in each block of inverter gate 400A would be set to "0" or "1" as shown in FIG. 4A. As a result, the inputs to the P-type MOSFETs in each block of inverter gate 400A would also be "0" or "1" as shown in FIG. 4A. As shown in FIG. 4A, the output of each N-type logic circuit (Y1, Y1-bar, Y2, Y2-bar) in inverter 400A is then used as the input of each N-type logic circuit in inverter gate 400B. As a result, as also shown in FIG. 4A, the output of each N-type logic circuit (Y3, Y3-bar, Y4, Y4-bar) in inverter gate 400B is the complement of the output of the corresponding N-type logic circuit in inverter gate 400A.

Figure 4B:
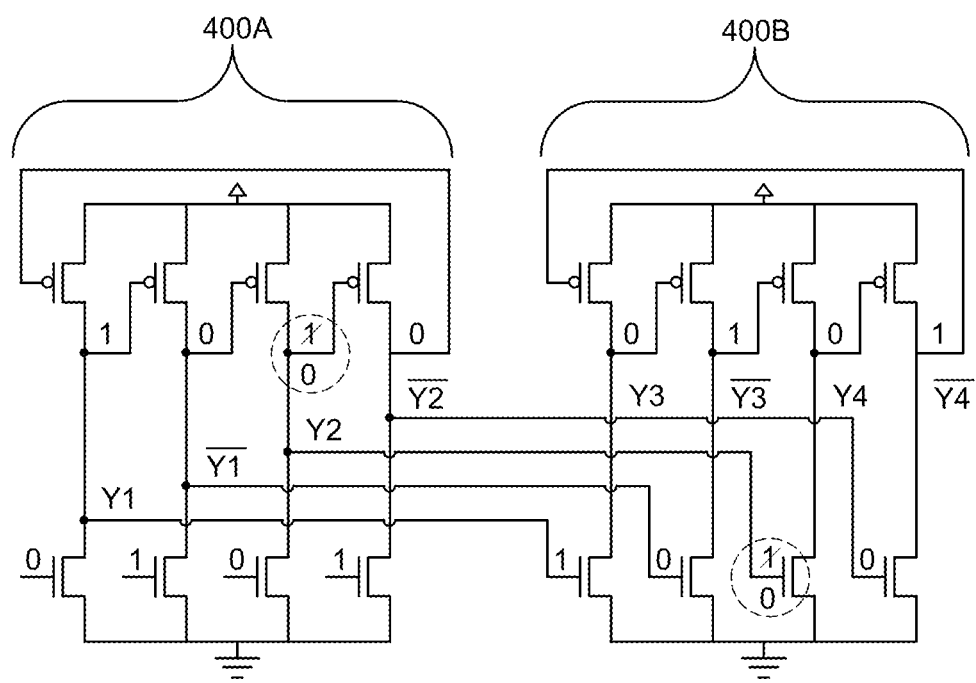
FIG. 4B shows the two serially-connected DIL inverter gates of FIG. 5A following an SET that causes an output node within the first inverter to transition from 1 to 0.

FIG. 4B shows the two serially-connected DIL inverter gates of FIG. 4A following an SET that causes an output node within the first inverter to transition from 1 to 0. In particular, an SET that causes the output Y2 to change from "1" to "0". As a result, the input to the N-type MOSFET for generating output Y4 is also changed from "1" to "0".

Figure 4C:
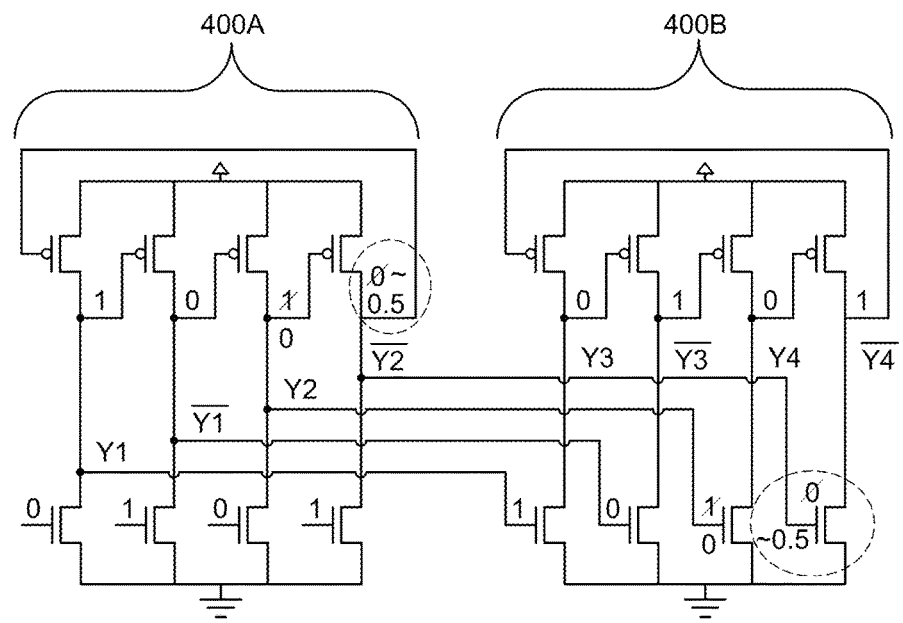
FIG. 4C shows two serially-connected DIL inverter gates following the SET event of FIG. 5B showing a transition on an adjacent output node of the first inverter.

FIG. 4C shows the two serially-connected DIL inverter gates following the SET event and the transitions in FIG. 4B. As shown in FIG. 4C, the transition at output Y2 causes only a partial transition at the subsequent block. In particular, Y2-bar will transition to an intermediate value between "0" and "1". This is because the transition at Y2 will only be temporary and consequently the P-type MOSFET controlled by output Y2 will not fully transition. As a result, the final voltage at Y2-bar will instead be determined by the relative drive strengths of the P-type MOSFET and the N-type MOSFET associated with Y2-bar. For sake of illustration, it is assumed that Y2-bar transitions to a "0.5" value between "0" and "1". This also causes the input to the N-type MOSFET for generating output Y4-bar to also changed from "0" to "0.5".

Figure 4D:
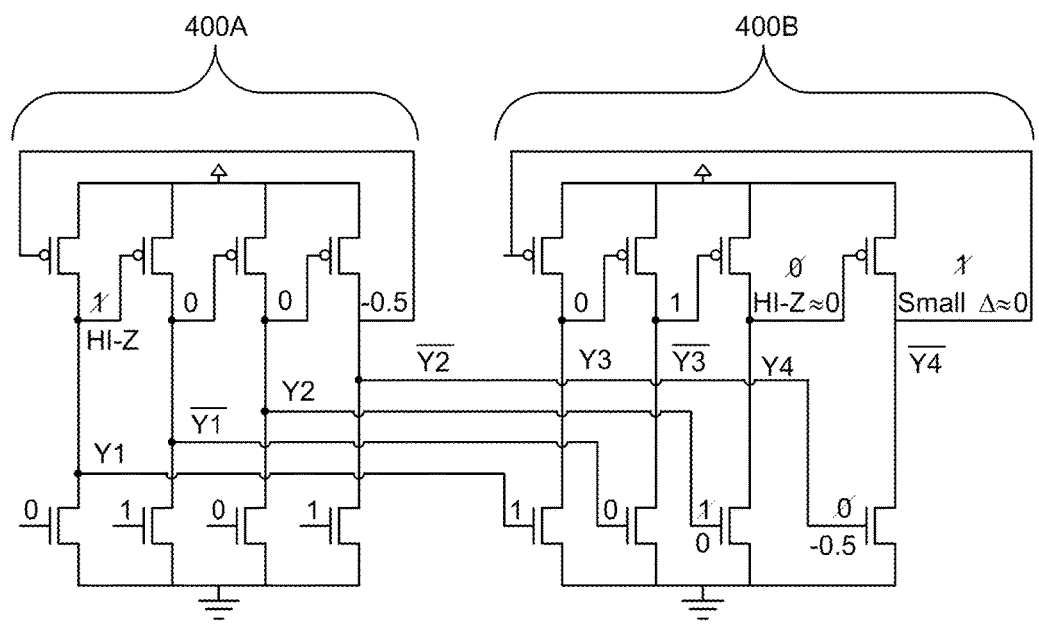
FIG. 4D shows two serially-connected DIL inverter gates following the transition of FIG. 5C showing no change in the logic state for the second inverter after the transition of FIG. 5C.

FIG. 4D shows two serially-connected DIL inverter gates following the transitions of FIG. 4C and showing no change in the logic state for the output (Y4-bar) of second inverter gate 400B. In particular, although the input to the N-type MOSFET associated with Y4 transitions to a "0", the input to the P-type MOSFET associated with Y4 remains unchanged. Thus, even though the N-type MOSFET is turned "off" by the transition at Y2, the P-type MOSFET associated with Y4 is not turned "on". Accordingly, Y4 does not transition to a "1" and instead a high impedance is provided at Y4. As a result, Y4 remains at or close to "0". Consequently, the P-type MOSFET controlled by Y4 and associated with output node Y4-bar remains "on". Further, since the N-type MOSFET associated with Y4-bar only partially transitions and is only partially "on", the output at Y4-bar will be dominated by the P-type MOSFET that is completely "on". Thus, the output at Y4-bar will remain at or close to "1".

Therefore, as illustrated in FIGS. 4A-4D, the result of the transient in the first inverter gate only causes one of the outputs in the second inverter gate to become high impedance (Hi-Z) with no change in its logic state, and the adjacent node in the second inverter gate has only a small change (small Δ). The other two outputs in the second inverter remain unchanged. Thus, FIGS. 4A-4D illustrate that an SET at a single node in a first DIL gate is not capable of propagating past the subsequent DIL gate.

Although the arrangement of a DIL gate is illustrated and discussed above with respect to inverter gate, the present disclosure contemplates the same type of arrangement can be utilized to provide gates for any type of logic function. That is "n-logic" and "n-logic bar" can be any arbitrary type of logic function and its complement, respectively. Such DIL gates produce 2N outputs and require M sets of 2N inputs where N?2 and M?1. For a given design, all DIL gates will have the same N, however each gate may have a different M depending on the logical function being implemented.

Figure 5A:
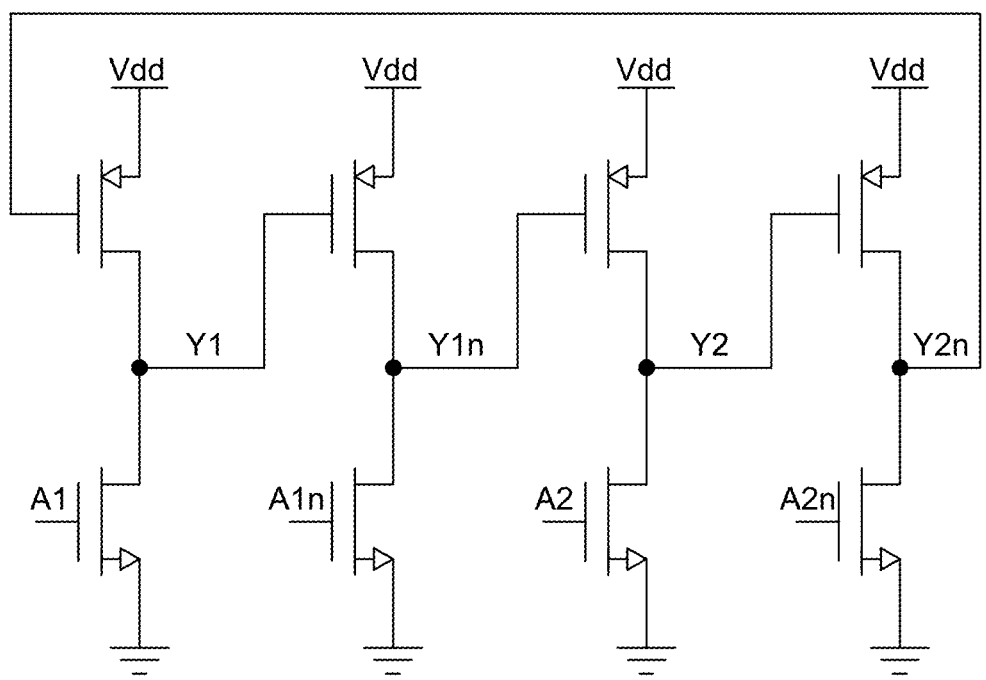
FIG. 5A shows an exemplary DIL inverter gate.
Figure 5B:
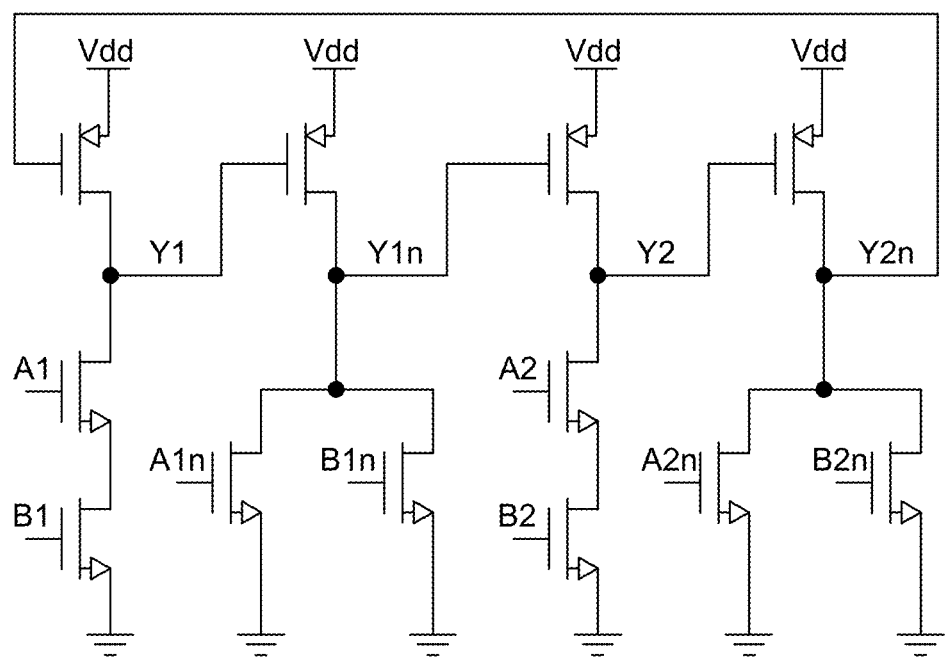
FIG. 5B shows an exemplary DIL NAND gate.
Figure 5C:
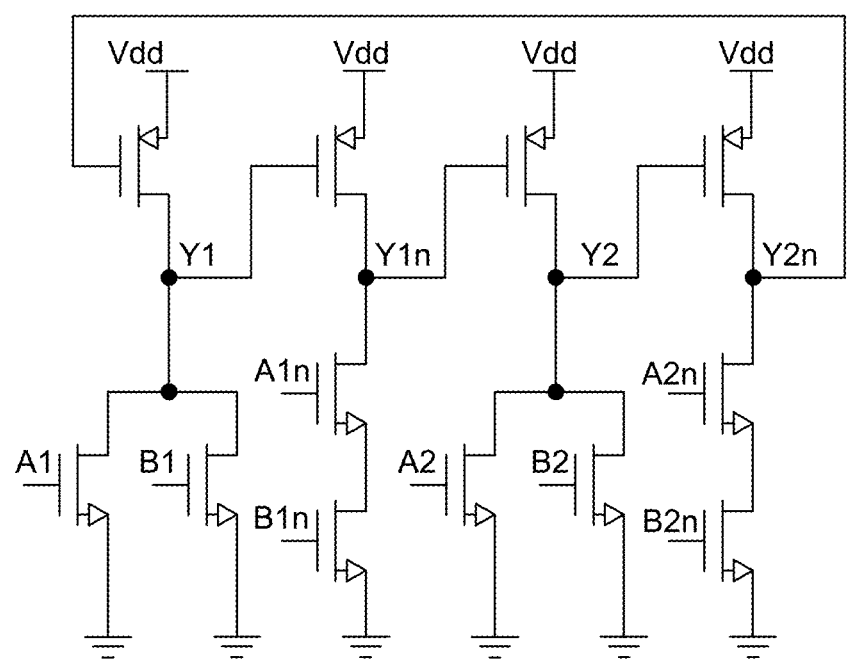
FIG. 5C shows an exemplary DIL NOR gate.

For example, FIG. 5A is an exemplary DIL inverter gate 502 with N=2 and M=1, thus providing 2(2)=4 outputs (Y1, Y1$n$, Y2, Y2$n$) and requiring 1 set of 2(2) inputs (A1, A1$n$, A2, A2$n$). For purposes of FIGS. 5A-5D, "n" should be interpreted as "bar." FIG. 5B is an exemplary DIL NAND gate 504 with N=2 and M=2, thus providing 2(2)=4 outputs (Y1, Y1$n$, Y2, Y2$n$) and requiring 2 sets of 2(2) inputs (A1, A1$n$, A2, A2$n$ and B1, B1$n$, B2, B2$n$) inputs. FIG. 5C is an exemplary DIL NOR gate 506 also with N=2 and M=2, thus also providing 2(2) requiring 2 sets of 2(2) inputs (A1, A1$n$, A2, A2$n$ and B1, B1$n$, B2, B2$n$) inputs.

Thus in order to build a combinational logic circuit, a DIL gate must be fed using an adequate number of inputs. This is illustrated in FIG. 5D, which shows a simple logic circuit constructed from the gates in FIGS. 5A-5C.

Figure 5D:
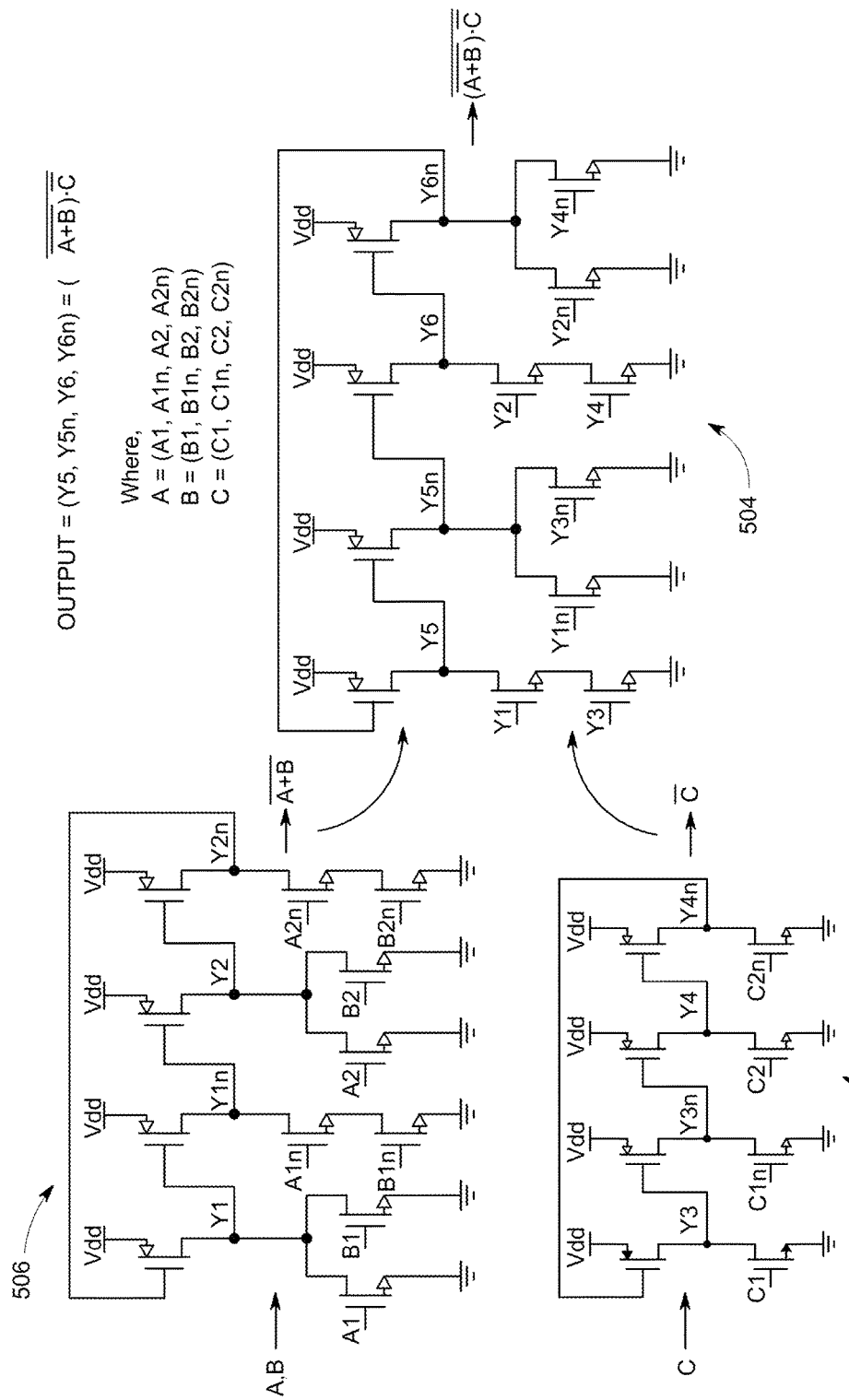
FIG. 5D shows an exemplary DIL combination logic circuit using the DIL gates of FIGS. 5A-5C.

As shown in FIG. 5D, the circuit provides the function (A+B)·C. The function (A+B) is provided by supplying inputs A and B to DIL NOR gate 506, where A1, A1$n$, A2, and A2$n$ are used for A and inputs B1, B1$n$, B2, and B2$n$ are used for B. DIL NOR Gate 506 then produces four outputs Y1, Y1$n$, Y2, Y2$n$ representing (A+B). The function is provided by C supplying input C to DIL Inverter gate 502, where C1, C1$n$, C2, and C2$n$ are used for C. DIL Inverter Gate 502 also produces four outputs Y3, Y3$n$, Y4, Y4$n$ representing C. The outputs are then fed into DIL NAND gate 504, wherein the first input is (A+B) and the second input is C, represented by the sets of inputs Y1, Y1$n$, Y2, Y2$n$ and Y3, Y3$n$, Y4, Y4$n$, respectively. In this way, the DIL NAND gate 504 receives the 2 sets of 4 input needed to produce the output (A+B)C, represented by outputs Y5, Y5$n$, Y6, and Y6$n$.

In the various embodiments, inputs for an initial gate in the DIL combinational logic can be generated in a variety of ways. In some embodiments, a DICE latch, as illustrated in FIG. 1 can be used to store a value. The 4 signals then needed for an input, such as A, B, or C in FIG. 5D, can then be taken from the output of each inverter in the DICE latch. In other embodiments, a single signal can be provided and split and inverted as needed to generate the necessary inputs.

The output of the DIL combinational logic can be used or stored in a similar way. For example, a DICE latch, as illustrated in FIG. 1 can be used to store the output of a DIL combinational logic. That is, the 4 signals output, such as Y5, Y5$n$, Y6, and Y6$n$ in FIG. 5D, can be tied to the input of each inverter in a DICE latch so as to allow the value to be stored. In other embodiments, a single signal of interest can be extracted and/or stored as needed.

Robust Synchronous System Integration

Figure 6:
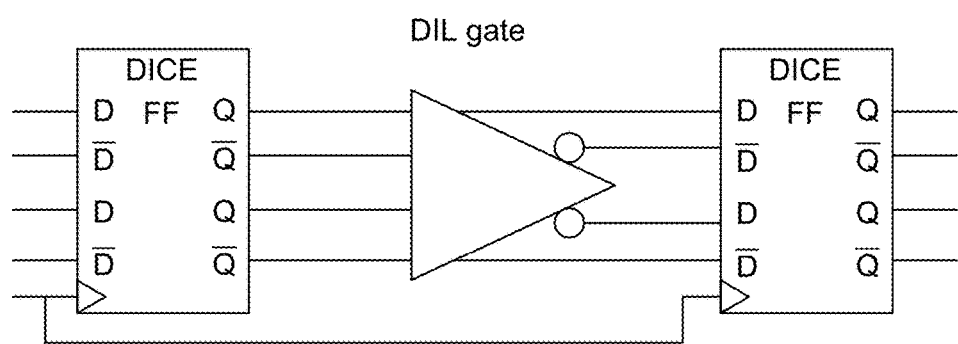
FIG. 6 shows an exemplary DIL combination logic circuit including DIL and Differential DICE components.

In a synchronous system consisting of combinational logic interspersed among clocked storage elements, errors may occur due to both SEUs in the storage elements and SETs in the combinational logic. To protect a synchronous system against SEU, flip-flops based on DICE storage latches have been shown to be very effective against single-node strikes; however, they are still vulnerable to dual-node strikes and clock errors. Several different variations of the DICE flip-flop have been developed, such as the fully-differential DICE topology. It has been shown that a synchronous data transfer system (i.e. no combinational logic) utilizing the fully-differential DICE flip-flop is not susceptible to SETs which can be generated in the transparent stages of the DICE flip-flop. However, if traditional logic topologies are utilized between the differential DICE flip-flops, the system becomes vulnerable to SETs. Due to the differential input/output configuration of the DIL topology, it is able to naturally integrate with a differential DICE flip-flop, as shown in FIG. 6, to form a synchronous system that is robust to both SETs and SEUs. The DIL topology enhances the use of the fully-differential DICE flip-flop by providing a combinational logic structure that can be integrated alongside the fully-differential DICE flip-flop without inducing an SET sensitivity. Due to its compatibility with DICE flip-flops, DIL is a valuable addition to existing RHBD libraries that already have a DICE design.

Figure 7:
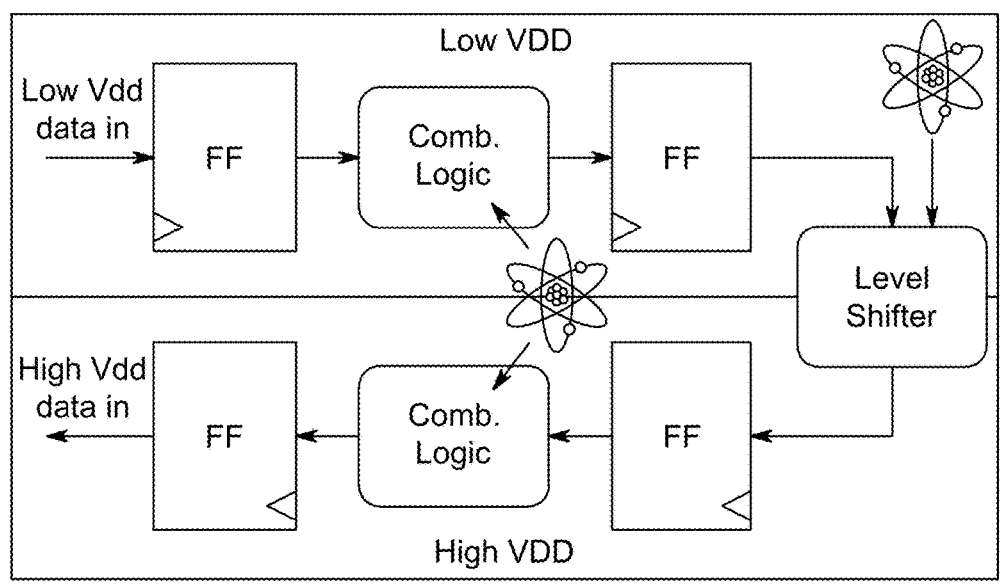
FIG. 7 shows a simplified diagram of a voltage-island-partitioned IC.

Power consumption is of utmost concern in modern IC designs. A highly common technique to reduce both static and dynamic power is voltage scaling. As the supply voltage is decreased, the dynamic power goes down proportional to the square of the voltage while also reducing the leakage power. The tradeoff in this case is reduced speed and noise margins. In order to circumvent the effect of the reduced speed while still maintaining low power operation, ICs can be partitioned into voltage islands, see FIG. 7, where each voltage island is operated at the lowest voltage that still allows it to meet timing requirements. Logic signals that traverse from one voltage island to another must have their voltage level translated using a voltage level shifter in order to prevent static current flow that can arise when a low voltage gate cannot fully turn on a high voltage gate.

In various drawings, there is presented an atom symbol in combination with an arrow. In the various drawings, these are meant solely to represent where a strike may occur.

Voltage Level Shifters in Voltage Partitioned Ics

When utilizing voltage island partitioning, logic signals that traverse from one voltage island to another must have their voltage level translated using a voltage level shifter in order to prevent static current flow that can arise when a low voltage gate cannot fully turn on a high voltage gate. In this way, level shifters act as gateways of information between different voltage islands, thus making them critical components to investigate for a rad-hard system. Very little research has been published on the design of radiation hardened level shifters, and no actual broad-beam radiation data has been published on the sensitivity of level shifters. Since level shifters operate between two different voltage domains, they may exhibit unique single event vulnerabilities that are not present in other combinational logic.

Figure 8A:
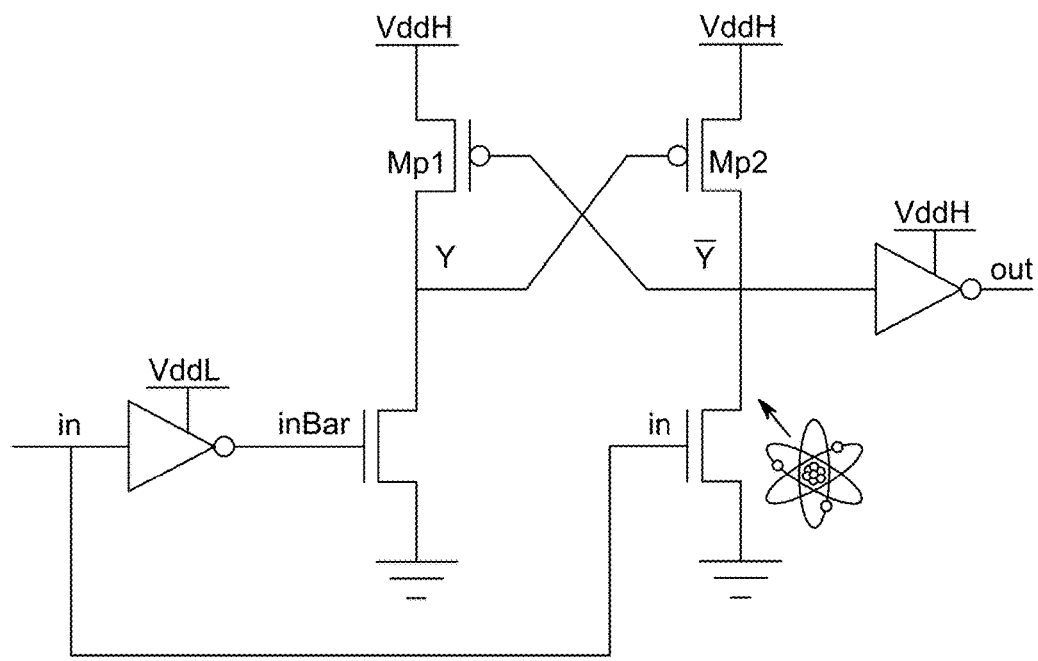
FIG. 8A shows a schematic of a basic level shifter topology.

The most basic level shifter topology consists of a cross-coupled PMOS pair driven by a differential NMOS logic tree, as shown FIG. 8A. The data driving the NMOS pair originates in the low voltage domain, VddL, and may either come from previous combinational logic or a storage element. The cross-coupled PMOS pair is driven by the weakly-driven NMOS pair, but produces an output that is in the high voltage domain, VddH, due to the assistance of the cross-coupled feedback.

Several variations of the basic level shifter have been designed to improve performance parameters such as switching threshold, delay and power, but few have analyzed the radiation vulnerabilities of the various topologies, especially across a range of voltage domains. Several energy efficient level shifters have been proposed and thoroughly analyzed electrically, but without reference to single events. The present disclosure expands the single-event sensitivity of level shifters by using a state-of-the-art SEE model to investigate SET duration across a range of low voltage domains as opposed to a calculating a single critical charge value at a single voltage.

Figure 8B:
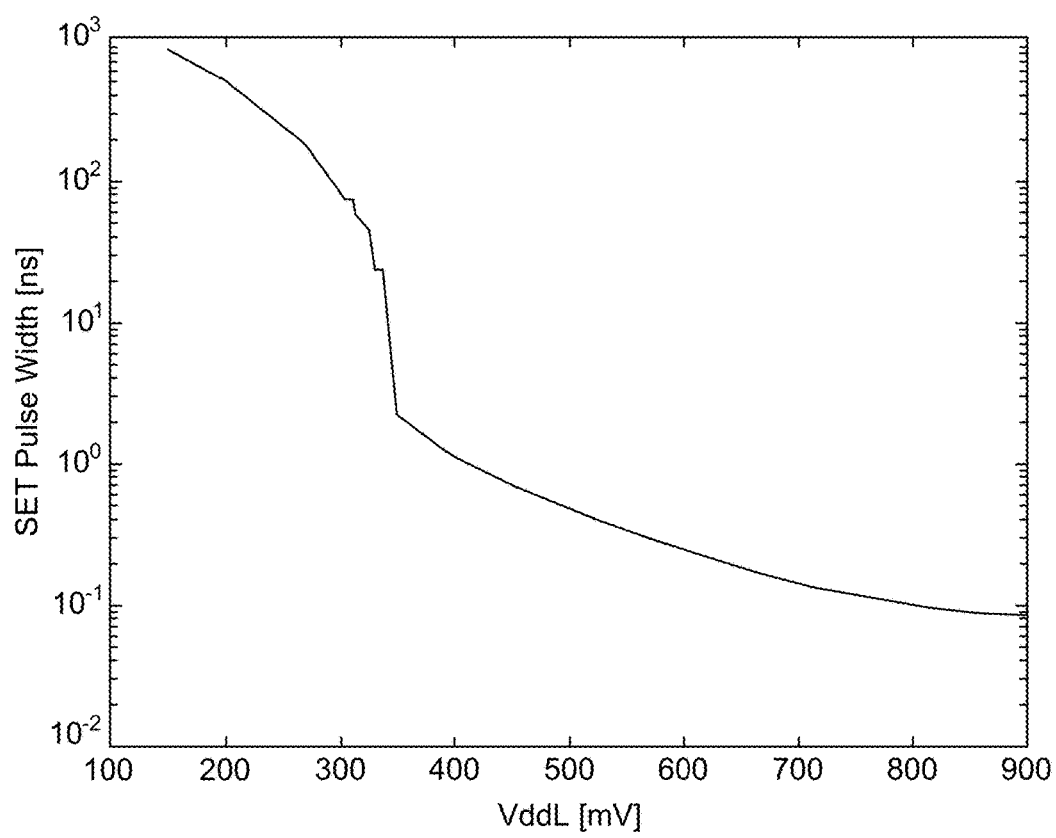
FIG. 8B shows an x-y plot of the SET duration as a function of voltage for the low voltage domain when the OFF NMOS is struck with an LET of 50 MeV·cm2/mg.

The basic level shifter shown in FIG. 8A was designed in the 32 nm SOI PDK. SPICE simulations show that the design is functional for a low voltage range of 350 mV to 900 mV while the high voltage domain is at 900 mV, which is nominal for the technology. The RHBD3 SEE model developed by Kauppila was used to investigate various failure modes across the full range of voltages in the low voltage domain. J. S. Kauppila et al., "Geometry-aware single-event enabled compact models for sub-50 nm partially depleted silicon-on-insulator technologies," IEEE Trans. Nucl. Sci., vol. 62, no. 4, pp. 1589-1598, August 2015. The simulation results from strikes to the OFF NMOS are shown in FIG. 8B. As the voltage in the low voltage domain decreases, the SET duration increases rapidly (notice the log scale for pulse width). This rapid increase is due to the fact that the restoring current for the strike essentially comes from the weakly driven ON NMOS through the PMOS feedback. Given this sensitivity, the DIL hardening technique was applied so that the feedback dependence between the struck node and the restoring node would be interrupted.

Figure 9A:
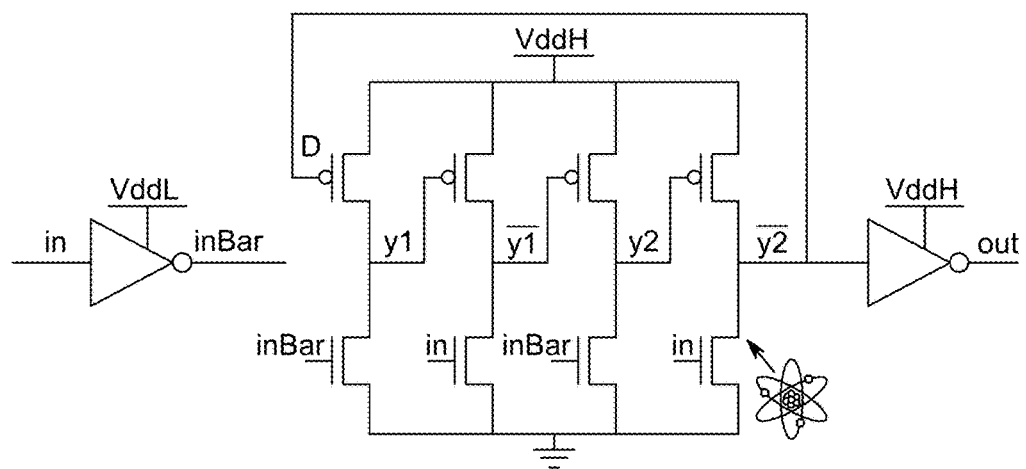
FIG. 9A shows a schematic of a basic level shifter topology hardened via interlock feedback in the PMOS half latch.
Figure 9B:
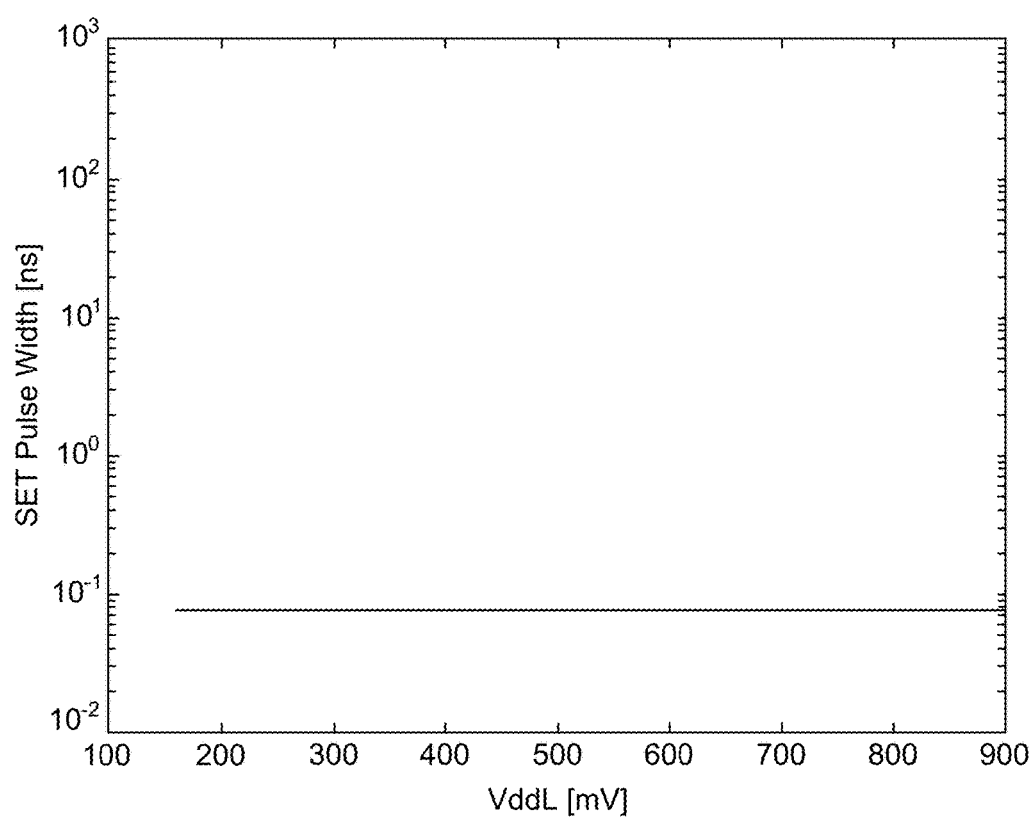
FIG. 9B shows an x-y plot of the SET duration as a function of voltage for the low voltage domain when the OFF NMOS is struck with an LET of 50 MeV·cm2/mg.

In order to create a RHBD level shifter, DIL was applied to the traditional level shifter, as shown in FIG. 9A. FIG. 9A shows the schematic of a basic level shifter which is hardened according to the present disclosure. The hardened nature comes from interlocked feedback in an implemented PMOS half latch. The operation of the DIL level shifter is similar to the operation of the DIL inverter logic gate, except that in the case of the DIL level shifter, the inputs to the NMOS transistors are driven by a lower supply voltage signal than the voltage supply to the interlocked PMOS half latch. The output of the DIL level shifter is insensitive to strikes on nodes that are not directly feeding the output such as Y1, Y1bar and Y2 in FIG. 9A. This is a similar topology to the one proposed by Palakurthi et al., in which they proposed incorporating an entire DICE latch in place of the PMOS half latch. P. Palakurthi, J. Martinez, and E. MacDonald, "Radiation hardened level shifter for sub to super-threshold voltage translation," in 2012 IEEE Subthreshold Microelectronics Conference (SubVT), 2012, pp. 1-3. The design proposed here is simpler and does not require having a full DICE latch, only a PMOS half latch. Similar simulations to FIG. 8B were performed with the hardened level shifter, and the results are shown in FIG. 9B. The interlocked feedback takes away the voltage sensitivity of the SET duration; however, a short SET is still produced at the output for some strikes due to the design being single-ended.

EXAMPLES

The examples shown here are not intended to limit the various embodiments. Rather they are presented solely for illustrative purposes.

Heavy-Ion Simulation Testing

The DIL topology discussed above has been verified via extensive Simulation Program with Integrated Circuit Emphases (SPICE simulation) and fault-injection analysis. Exemplary SPICE simulations have been performed in a 32 nm partially-depleted silicon-on-insulator (PDSOI) technology using fault injection, as well as a data-validated single event model.

The model has been validated at the 32 nm silicon on insulator (SOI) technology node with extensive heavy-ion data. For the SPICE simulations, three chains of three serially connected NAND gates were used. Each chain was designed using a different combinational logic topology: static CMOS, CVSL, and DIL. The schematics for each chain as well as the simulation results for each are shown in FIGS. 10A-12B. For each of the chains, a "worst case" simulation was performed by striking one of the parallel transistors in the first gate. This is "worst case" because it requires the restoring current to come from the stacked transistors. FIGS. 10A, 10B, 11A, and 11B demonstrate strikes to the static CMOS and CVSL NAND gates, which result in an SET that is capable of propagating to the output of the third gate. However, a strike to the gate utilizing the DIL topology, as illustrated in FIGS. 12A and 12B, does not produce an SET that is capable of propagating to the output. These results are discussed below in greater detail.

Figure 10A:
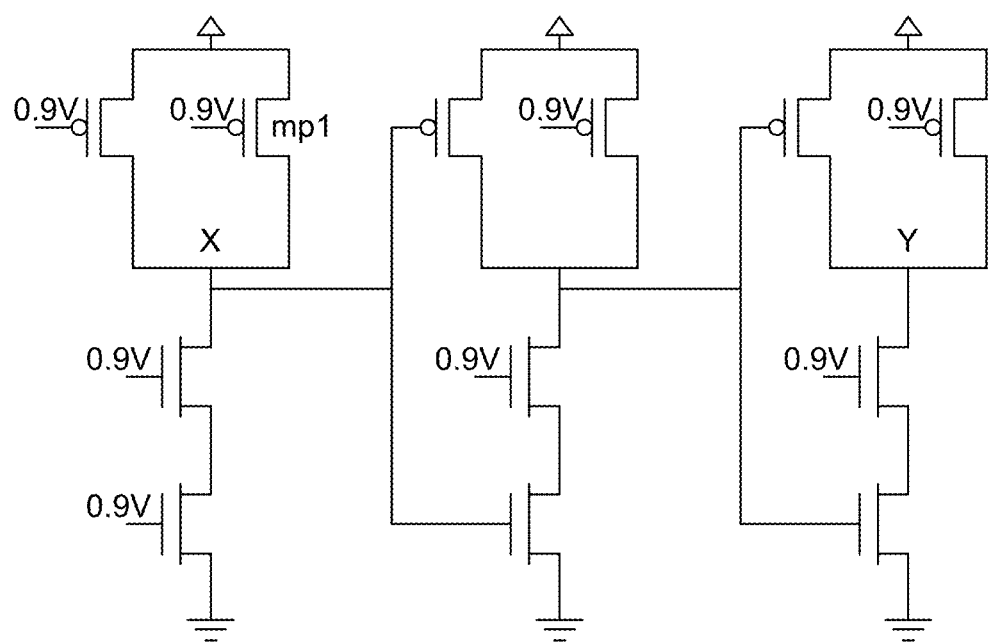
FIG. 10A shows a schematic of a standard NAND chain which is useful for describing the various embodiments.
Figure 10B:
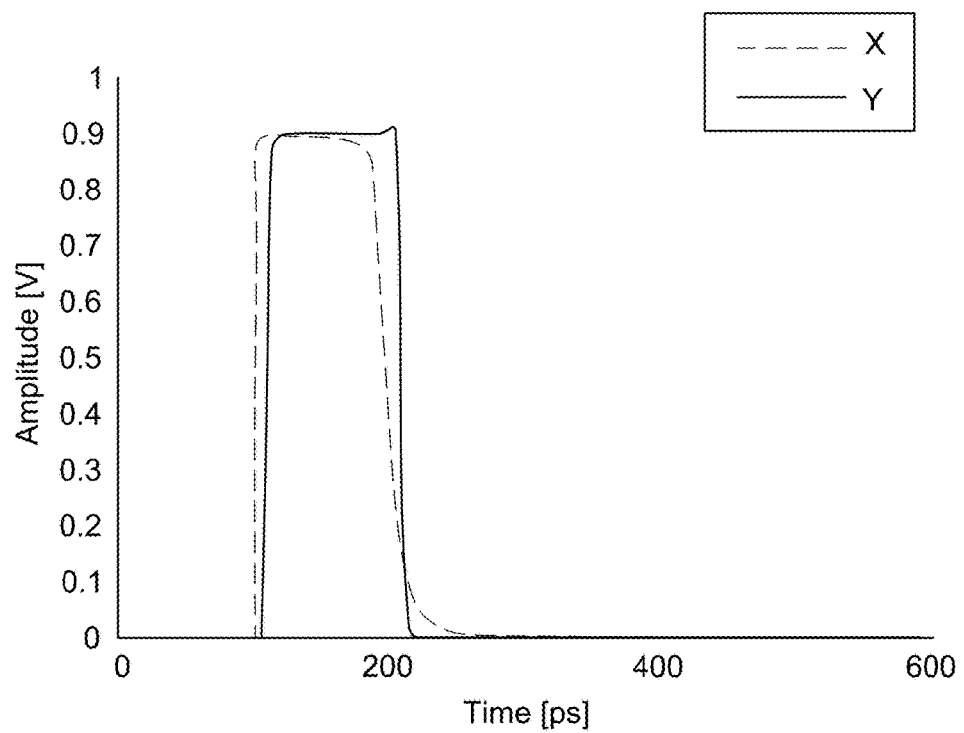
FIG. 10B is an x-y plot of simulated voltage at nodes X and Y of the NAND chain of FIG. 10A as a function of time after a strike on transistor mp1 of FIG. 5A.

FIG. 10A shows a schematic of a standard NAND chain which is useful for describing the various embodiments. FIG. 10B is an x-y plot of simulated voltage at nodes X and Y of the NAND chain of FIG. 10A as a function of time after a strike on transistor mp1 of FIG. 10A. In particular, FIG. 10B shows the SEE simulation results for the standard NAND chain of FIG. 10A using the 32 nm PDSOI SEE model with an LET of 60 MeV-cm2/mg. The results in FIG. 10B show the voltage at node X (dashed line), resulting from a strike on mp1, and the voltage at node Y (solid line), which is the output of the third gate. As shown in FIG. 10B, the transient produced at node X is able to propagate to node Y, and thus to the output of the chain in FIG. 10A.

Figure 11A:
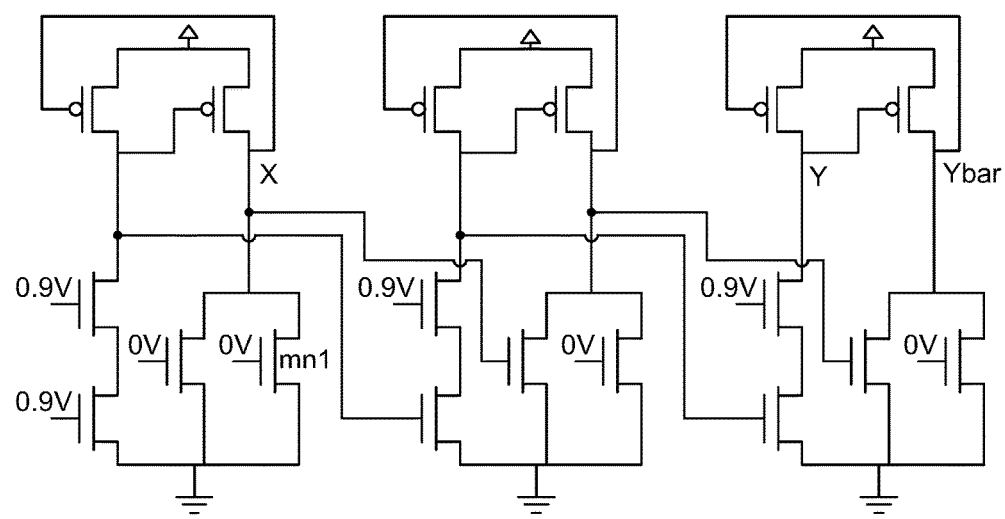
FIG. 11A shows a schematic of a standard CVSL NAND chain which is useful for describing the various embodiments.
Figure 11B:
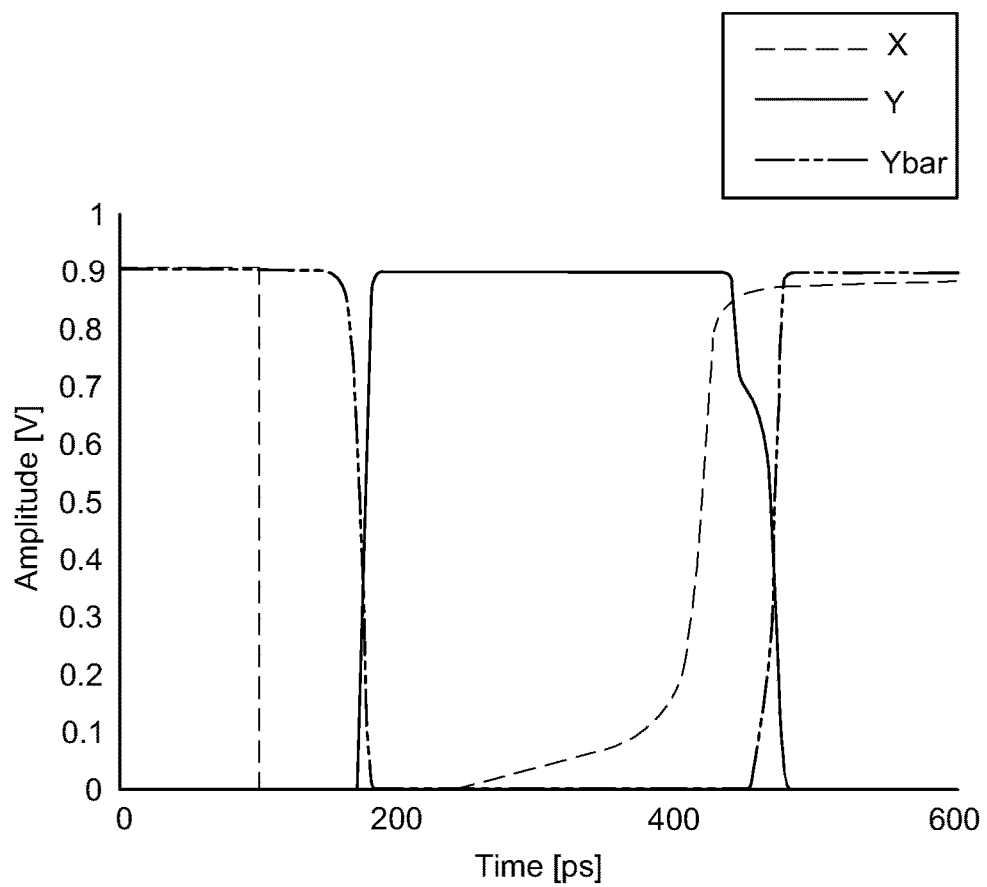
FIG. 11B is an x-y plot of simulated voltage at nodes X, Y, and Ybar of the NAND chain of FIG. 11A as a function of time after a strike on transistor mn1 of FIG. 11A.
Figure 12A:
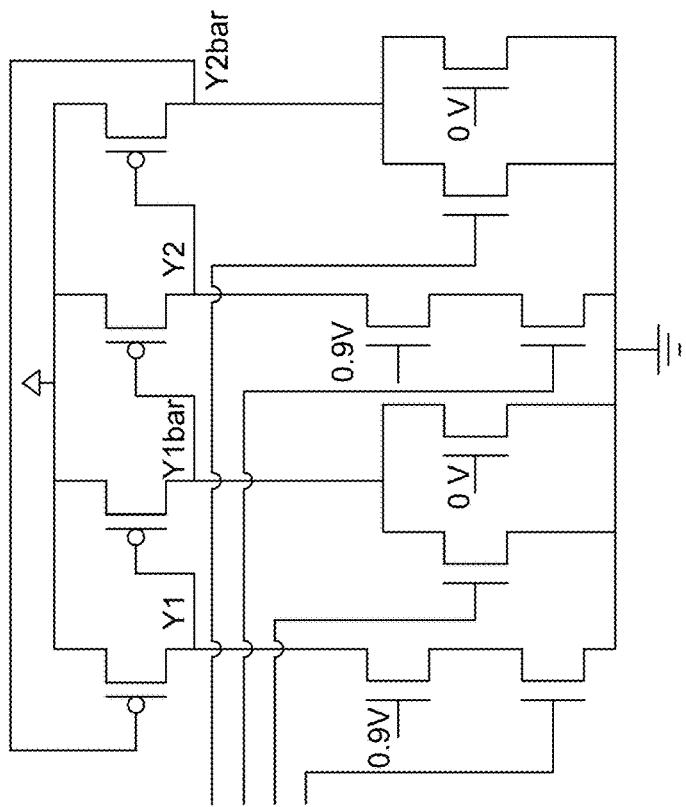
FIG. 12A shows a partial schematic of a DIL NAND chain according to an exemplary embodiment of the invention.
Figure 12A:
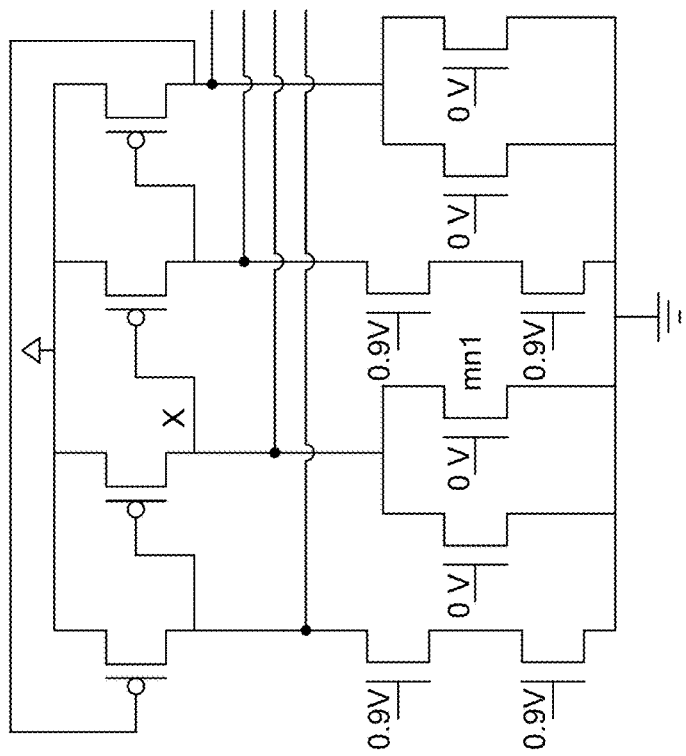
Figure 12B:
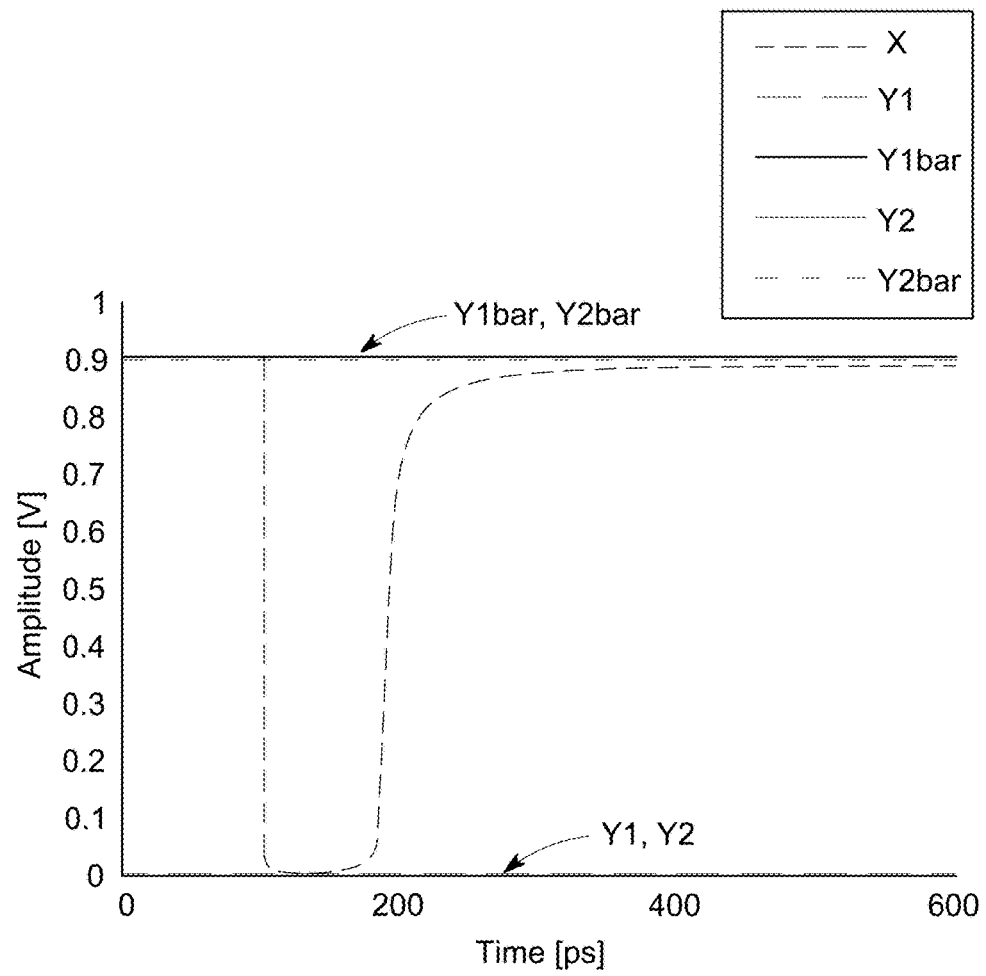
FIG. 12B is an x-y plot of simulated voltage at nodes X, Y1, Y1bar, Y2, and Y2bar of the NAND chain of FIG. 8A as a function of time after a strike on transistor mn1 of FIG. 12A.

FIG. 11A shows a schematic of a standard CVSL NAND chain which is useful for describing the various embodiments. FIG. 11B is an x-y plot of simulated voltage at nodes X, Y, and Ybar of the NAND chain of FIG. 11B as a function of time after a strike on transistor mn1 of FIG. 11A. In particular, FIG. 11B shows the SEE simulation results for the standard CVSL NAND chain of FIG. 11A using the 32 nm PDSOI SEE model with an LET of 60 MeV-cm2/mg. The results in FIG. 11B show the voltage at node X, resulting from a strike on transistor mn1, and all of the outputs of the third gate (Y and Y-bar), as identified in FIG. 11A. As shown in FIG. 11B, the transient produced at node X is able to propagate to both outputs of the third gate, nodes Y and Y-bar.

FIG. 12A shows a partial schematic of a DIL NAND chain according to an exemplary embodiment of the invention. Only 2 of 3 DIL NAND gates are shown for clarity. FIG. 12B is an x-y plot of simulated voltage at nodes X, Y1, Y1bar, Y2, and Y2bar of the NAND chain of FIG. 12A as a function of time after a strike on transistor mn1 of FIG. 12A. In particular, FIG. 12A shows the SEE simulation results for a hardened DIL NAND chain using the 32 nm PDSOI SEE model with an LET of 60 MeV-cm2/mg. The results in FIG. 12B show the voltage at node X, resulting from a strike on transistor mn1, and all of the outputs of the third gate (Y1, Y1-bar, Y2, and Y2-bar) are shown. As shown in FIG. 12B, none of the outputs respond to the transient at node X. Accordingly, this illustrated that transient produced at node X does not propagate to any of the outputs of the third gate.

On-Chip Device Testing

To further evaluate the DIL methodology described here, a test chip with on-chip SET pulse measurement circuitry was designed and fabricated at the 16 nm/14 nm bulk finFET technology generation. Test chips were tested both electrically and in heavy-ion broad-beam. The test chips were mounted on a custom-designed printed circuit board, and the circuit board communicated with user computers via an on-board microcontroller. The chips were irradiated under vacuum and at room temperature with heavy-ions at the Lawrence Berkeley National Laboratory 88-in Cyclotron facility. The target circuitry includes chains of 2-input CVSL NAND gates, 2-input DIL NAND gates, as well as several static inverter designs. To ensure electrical functionality, pulses of known width were injected into the inverter and DIL chains using an on-chip pulse generator and successfully measured using on-chip pulse capture circuitry. The test structures were irradiated using Lawrence Berkeley National Labs (LBNL) 88" cyclotron with 16 MeV/u Si ions (LET @ 0°=4.6 MeV·cm2/mg) at both normal incidence and at 80° tilt with a range of roll angles. Irradiations were carried out at room temperature, nominal supply voltage (0.8 V) and to a minimum fluence of 1×108 ion/cm2. Approximately 30 to 50 transients were recorded for the CVSL chain in each run. At normal incidence, the ion passes through only one sensitive node in each topology. Since the DUT was elevated above the surface of the package and bond-wires were only present on two sides, very high tilt angles were possible. At high tilt angles it is possible for a single ion to pass through multiple nodes. A tilt angle of 80° was chosen in order to ensure a dual-node strike in both the DIL and CVSL chains, corresponding to the two struck nodes in the SEE simulations presented in FIGS. 11A-12B. The 16 MeV/u cocktail at LBNL was chosen in order to ensure that the ions had enough penetration depth to pass through the back-end-of-line material and both nodes in the logic gates. Si ions were chosen for this test, which have a max range of 274 μm in silicon.

Figure 13A:
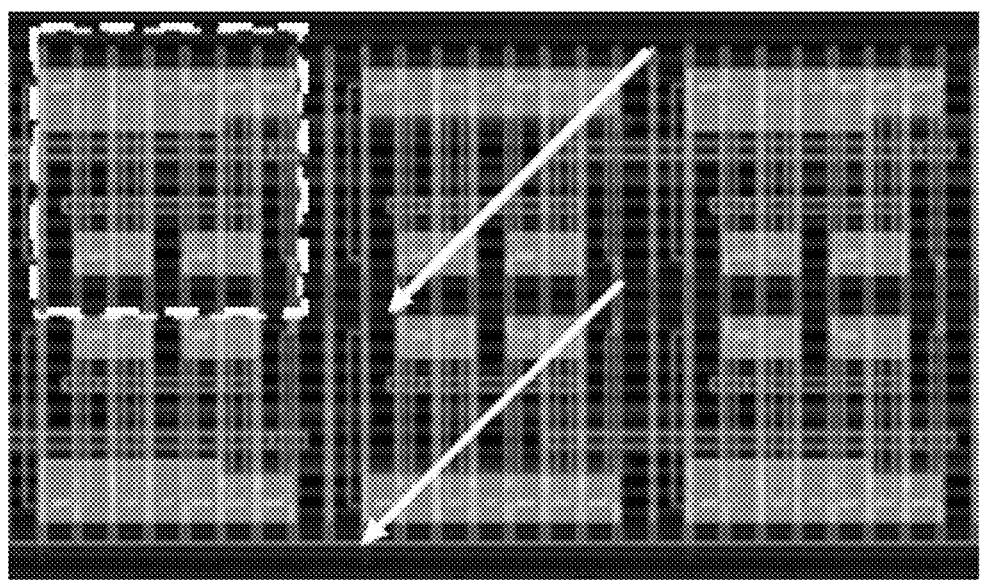
FIG. 13A shows schematic of a physical layout of a portion of the CVSL NAND2 target chain.
Figure 13B:
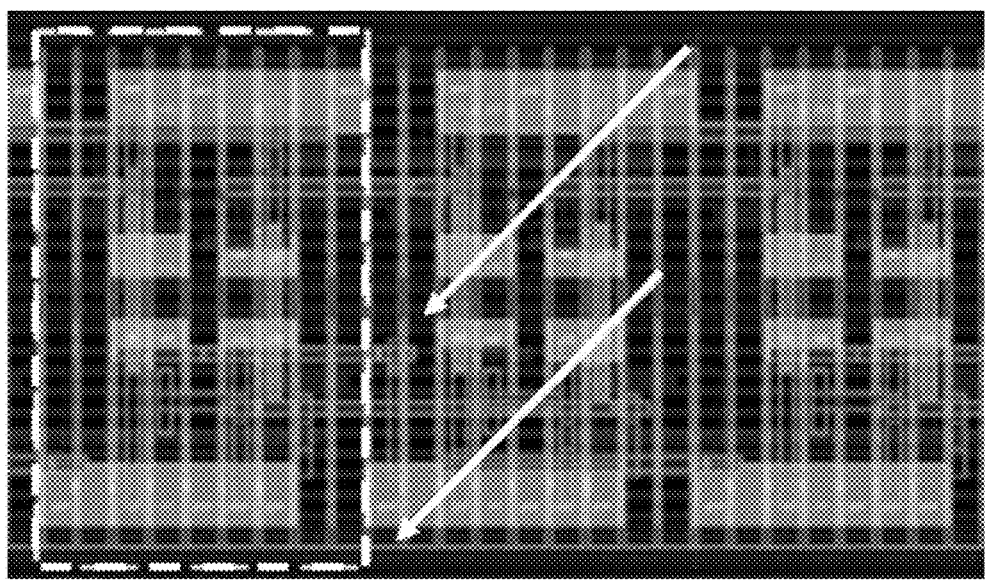
FIG. 13B shows a schematic of a physical layout of a DIL NAND2 target chain.

FIGS. 13A and 13B show physical layout for CVSL and DIL gates. FIG. 13A shows the physical layout of a portion of the CVSL NAND2 target chain. FIG. 13B shows the physical layout of a portion of the DIL NAND2 target chain. In both FIGS. 13A and 13B, the dashed boxes represent one logic gate cell and the arrows indicate a roll orientation of 45 degrees. The CVSL and DIL gates shown in FIGS. 13A and 13B, have very similar physical layouts and node spacing, but have differences in their wiring configurations.

Figure 14A:
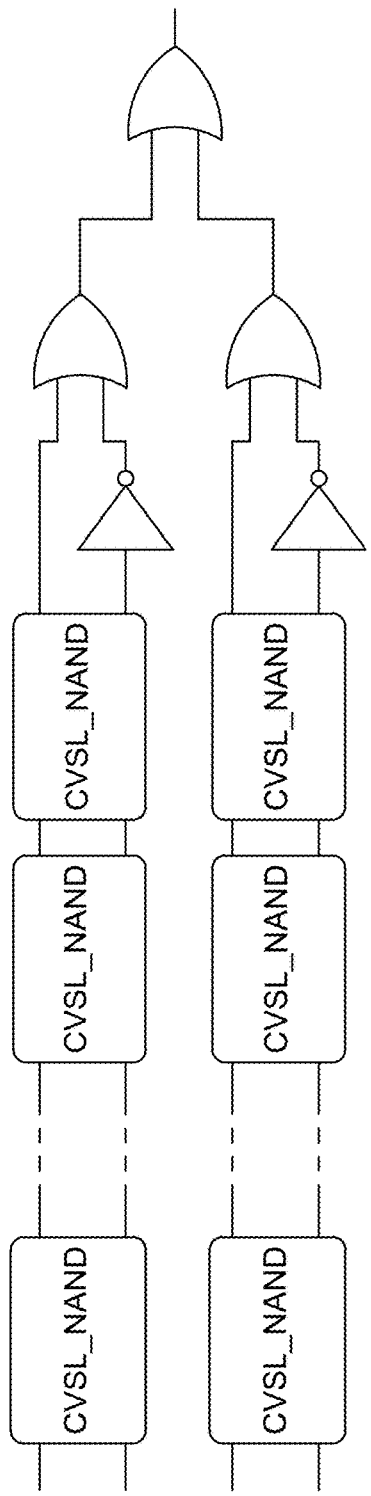
FIG. 14A shows a schematic diagram of a CVSL NAND2 target chain.
Figure 14B:
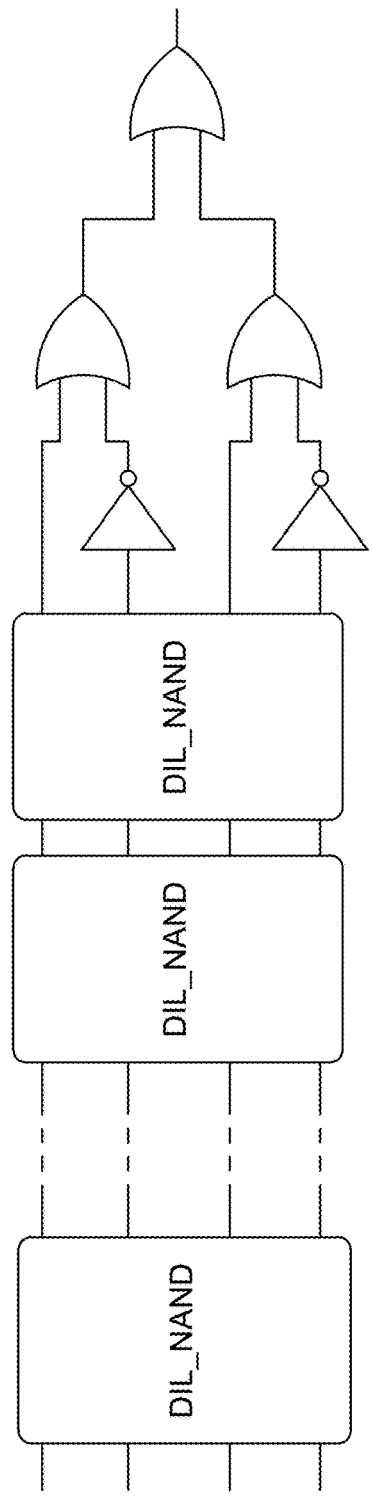
FIG. 14B shows a schematic diagram of a DIL NAND2 target chain.

Since both DIL and CVSL produce differential signals, standard static CMOS logic was incorporated at the output of each CVSL/DIL chain in order to combine their differential output into a single-ended output for the on-chip measurement circuit. An alternative approach would be to send each output to a separate measurement circuit, but space and input/output limitations restricted this configuration. The schematic for each logic chain along with the combining logic is shown in FIGS. 14A and 14B. FIG. 14A shows CVSL NAND2 target chains. FIG. 14B shows DIL NAND 2 target chains. Combinational CMOS logic was incorporated at the end of the chains in order to combine the differential outputs into a single-end output for the on-chip pulse capture circuit. The logic was selected such that a perturbation on any one of the output lines of the CVSL or DIL gates would be captured. This would prevent any logical masking.

The contribution of SETs from the static CMOS logic at the end of the DIL and CVSL chains are indistinguishable from SETs generated within the DIL and CVSL gates themselves, thus making it difficult to draw conclusions from looking at each chain independently. However, by comparing the DIL and CVSL chains to an all-static logic target structure (i.e., inverter chain), it is possible to identify additional sensitivities. At normal incidence all three logic topologies should be similar in cross section since the standard CMOS is single-node sensitive. At a tilt angle of 80°, the CVSL chain should show increased cross section over normal incidence since it is sensitive to dual-node strikes, and the DIL chain should not change in cross section.

Figure 15:
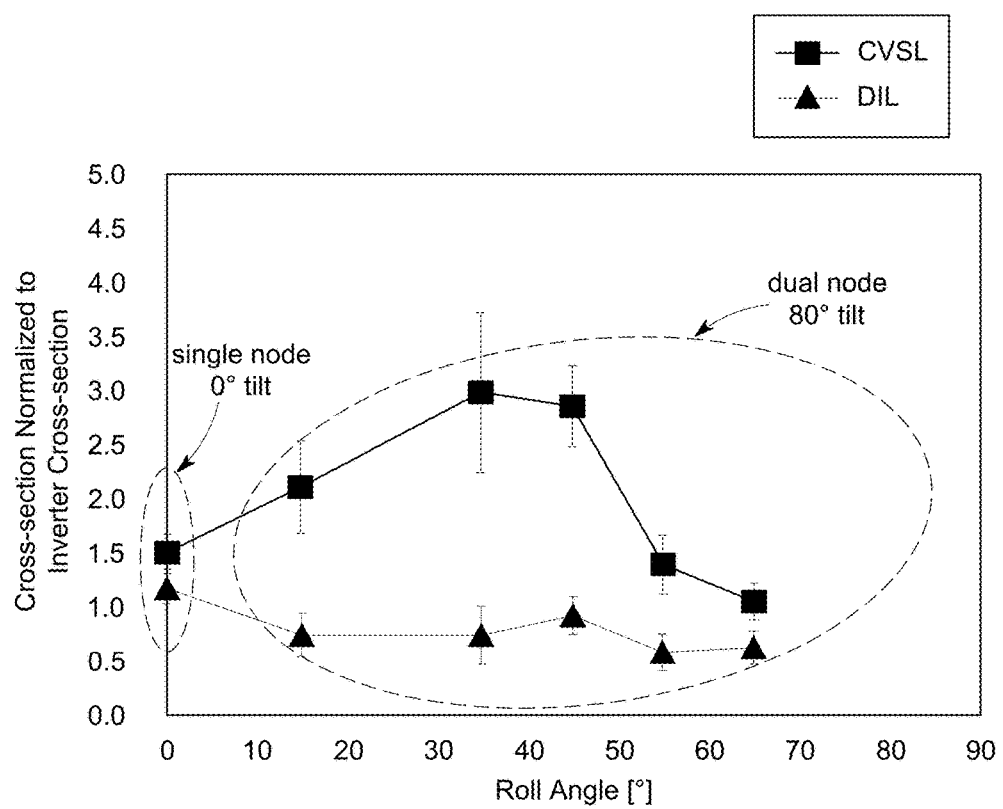
FIG. 15 shows an x-y plot of heavy ion radiation results for CVSL and DIL NAND target chains, plotting the heavy-ion cross-section by the roll angle.
Figure 16:
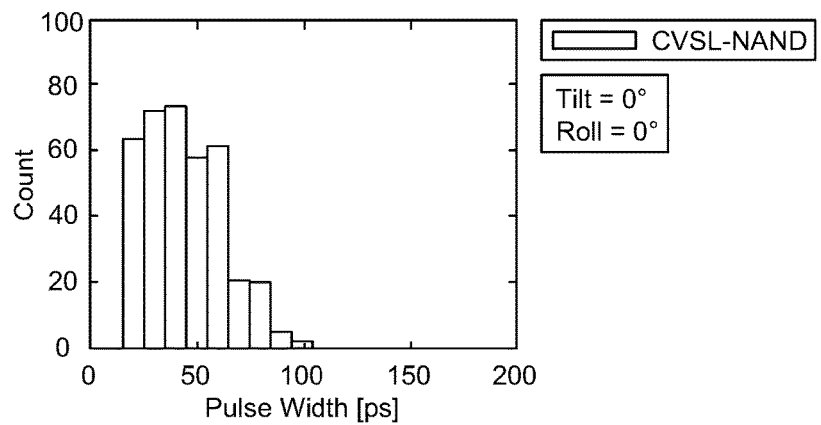
FIGS. 16Ai-Ciii show graphs of the CVSL, DIL, and inverter heavy-ion distributions using 16 MeV/u Si ions for different roll and tilt angles.
Figure 16:
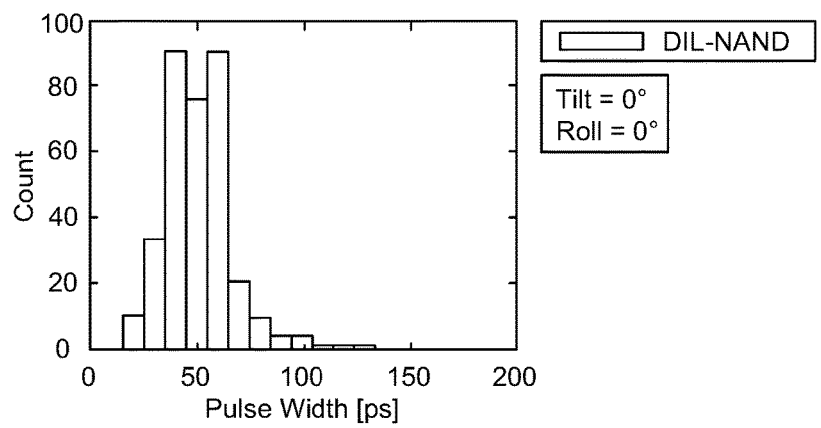
Figure 16:
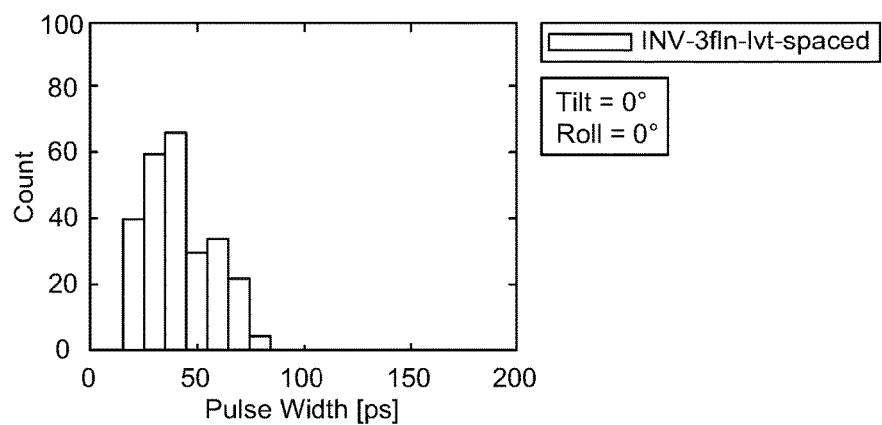
Figure 16:
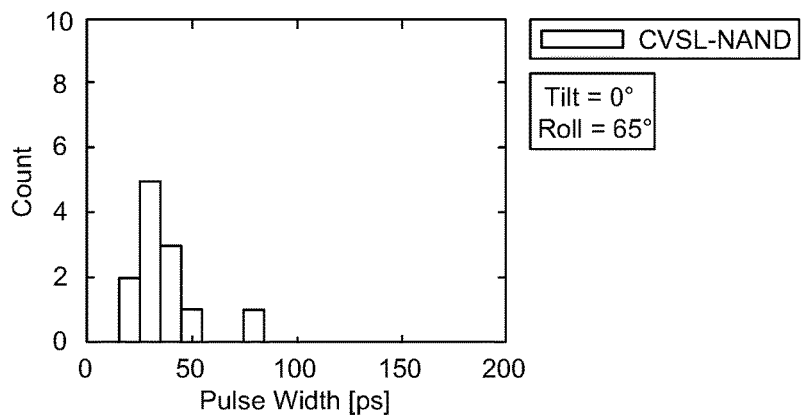

FIG. 15 shows the heavy-ion cross section, as calculated from the distributions in FIG. 16, for each target structure. A cross section per gate was first calculated by dividing the total error count for each target by the fluence and the number of known single-node sensitive gates. The CVSL chain has 11 single-node sensitive gates, DIL has 8, and the CMOS inverter chain has 22. The cross-section ratio, shown in FIG. 15, was calculated by dividing the CVSL and DIL cross section by the CMOS inverter cross section.

Data from all chains were measured simultaneously thus exposing all chains to the exact same experimental conditions (i.e. temperature, voltage, fluence, etc.). The chains were irradiated at normal incidence and at tilt angle of 80° across roll angles of 15°, 35°, 45°, 55° and 65°. The normal incidence irradiation was performed to evaluate the single-node sensitivity of each gate, and the 80° tilt irradiation was performed to evaluate the dual-node sensitivity of each gate. The arrows imposed on the physical layouts in FIGS. 9A and 9B correspond to a 45° roll orientation, showing the worst-case dual-node strike targeted during irradiation. The cross section for the CVSL is expected to peak around 45° roll since the ions will have the longest path through the two nodes at this roll angle.

At normal incidence both the CVSL and DIL chains are close to 1, meaning that their cross sections are the same as a standard inverter chain. It is assumed based on these data and simulations that the majority of the measured SETs at normal incidence are from the CMOS logic used at the end of each DIL/CVSL chain and not from within the DIL/CVSL chains themselves. As the irradiation moves from normal incidence to 80° tilt and 15° to 65° roll, the ions are capable of passing through multiple nodes as shown in FIGS. 10A and 10B. At this high tilt angle, the CVSL chain increases in cross section with respect to the inverter chain, while the DIL chain stays relatively constant. These data support the conclusion that the increase in cross section observed in the CVSL chain is due to the contribution of dual-node-induced SETs generated within the CVSL gates themselves which are in addition to SETs generated in the CMOS logic at the end of the chains. The relatively flat trend of the DIL gate over angle support the conclusion that the DIL gates are not sensitive to dual-node strikes, and that all of the SETs measured from the DIL target are due to the CMOS logic at the end of the chains.

FIGS. 16Ai-Ciii show CVSL, DIL, and inverter heavy-ion distributions using 16 MeV/u Si ions. The greatest number of events was measured at 0° roll and 0° tilt. As the tilt increases to 80° and the roll angle increases, the total number of events generally decreases. However, the CVSL gate exhibits a particularly higher sensitivity compared to the DIL and CMOS gates at 80° till and 45° roll. This increased sensitivity is due to dual-node sensitivity in the CVSL gate that is not exhibited in the DIL gate.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An electronic device, comprising:
    one or more gates, each of the gates comprising:
        a plurality of first circuit blocks configured for implementing a first N-type logic function; and
        a plurality of second circuit blocks configured for implementing a second N-type logic function that is a complement of the first N-type logic function;
        wherein a number of the plurality of first circuits and a number of the plurality of second circuits are the same,
        wherein the plurality of first circuit blocks and the plurality of second circuit blocks each have a block feedback node, a block output node, and one or more block input logic nodes, and
        wherein the block feedback node for each one of the plurality of first circuits is singly coupled to the block output node of one of the plurality of second circuits and the block output node of the one of the plurality of first circuits is singly coupled to the block feedback node of another of the plurality of second circuits.

2. The electronic device of claim 1, wherein each of the plurality of first circuit blocks and each of the plurality second circuit blocks each comprises:
    a pull-up circuit having a control node coupled to the block feedback node and a pull-up node;
    a N-type logic circuit implementing a corresponding one of the first logic function or the second logic function and having a logic circuit output node coupled to the pull-up node and one or more logic circuit input nodes coupled to the one or more block input nodes.

3. The electronic device of claim 2, wherein the pull-up circuit comprises a P-type transistor.

4. The electronic device of claim 1, wherein the number of the plurality of first circuits and the number of the plurality of second circuits are each 2N, where N is an integer greater than or equal to 1.

5. The electronic device of claim 1, wherein a number of the one or more gates is 2M, where M is an integer greater than or equal to 1.

6. An electronic device, comprising:
    one or more gates, each of the gates comprising:
        a plurality of circuit blocks, each configured to implement one of a first N-type logic function or a second N-type logic function; and
        wherein the plurality of circuit blocks each have a block feedback node and a block output node, and
        wherein the block feedback node for each one of the plurality of circuits is coupled to the block output node of another of the plurality of circuits, and wherein the plurality of circuits is coupled in an alternating series of the first N-type logic function and the second N-type logic function.

7. The electronic device of claim 6, wherein each of the plurality of circuit blocks comprises:
    a pull-up circuit having a control node coupled to the block feedback node and a pull-up node;
    a N-type logic circuit implementing a corresponding one of the first logic function or the second logic function and having a logic circuit output node coupled to the pull-up node and one or more logic circuit input nodes coupled to the one or more block input nodes.

8. The electronic device of claim 7, wherein the pull-up circuit comprises a P-type transistor.

* * * * *